(12) United States Patent
Akyol et al.

(10) Patent No.: US 11,620,946 B1
(45) Date of Patent: Apr. 4, 2023

(54) DUAL-MODE SENSE CIRCUIT WITH ENHANCED DYNAMIC RANGE AND ACCURACY

(71) Applicant: Apple Inc., Cupertino, CA (US)

(72) Inventors: Hasan Akyol, Los Altos, CA (US); Xuebei Yang, Fremont, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/686,227

(22) Filed: Mar. 3, 2022

(51) Int. Cl.
 *G09G 3/3233* (2016.01)

(52) U.S. Cl.
 CPC ... *G09G 3/3233* (2013.01); *G09G 2300/0819* (2013.01); *G09G 2320/045* (2013.01)

(58) Field of Classification Search
 CPC ......... G09G 3/3233; G09G 2300/0819; G09G 2320/045; G09G 2310/0291; G09G 2300/0838
 See application file for complete search history.

(56) References Cited

U.S. PATENT DOCUMENTS

| | | | |
|---|---|---|---|
| 9,106,849 B2 | 8/2015 | Duggal et al. | |
| 9,136,808 B2 * | 9/2015 | Kim | H03F 3/45475 |
| 11,121,713 B1 * | 9/2021 | Bardsley | H03K 17/102 |
| 2005/0186917 A1 | 8/2005 | Rofougaran et al. | |
| 2013/0217341 A1 | 8/2013 | Jones et al. | |
| 2013/0314273 A1 | 11/2013 | Kavaler et al. | |
| 2014/0111217 A1 * | 4/2014 | Shimomura | G01R 19/2503 324/434 |
| 2014/0327455 A1 * | 11/2014 | Steiner Vanha | G01D 5/24 324/686 |
| 2016/0211809 A1 * | 7/2016 | Chang | H03F 3/2171 |
| 2016/0334902 A1 * | 11/2016 | Li | G06F 3/0445 |
| 2019/0293691 A1 * | 9/2019 | Holland | G01R 19/0092 |
| 2020/0015341 A1 | 5/2020 | Nielsen et al. | |
| 2020/0395905 A1 | 12/2020 | Schober | |

* cited by examiner

*Primary Examiner* — Jeff Piziali
(74) *Attorney, Agent, or Firm* — Fenwick & West LLP

(57) ABSTRACT

A sensing circuit includes at least a first gain stage and a controller for controlling the operation of the first gain stage. The first gain stage includes an amplifier having at least one input and one output, and a feedback loop coupled between the input and the output of the amplifier. The feedback loop includes a first capacitor coupled between the input and the output of the amplifier, and a second capacitor having a first terminal coupled to the input of the amplifier through a first switch and a second terminal coupled to the output of the amplifier through a second switch. The second capacitor is configured to be coupled in parallel to the first capacitor during a first portion of a measurement cycle, and disconnected from the first capacitor during a second portion of the measurement cycle.

9 Claims, 13 Drawing Sheets

DUAL-MODE SENSE CIRCUIT WITH ENHANCED DYNAMIC RANGE AND ACCURACY

BACKGROUND

1. Field of the Disclosure

The present disclosure relates to integrated circuits, and more specifically to a circuit for sensing electrical characteristics (e.g., current or voltage) of an electronic system.

2. Description of the Related Art

In some circumstances, it is desirable to monitor the performance of electronic systems to make adjustments to the operation of the system when operating conditions of the electronic system start drifting. For example, as a display panel (such as an organic light emitting diode (OLED) display panel) is operated, it might be desirable to measure the current of one or more pixels to determine whether the pixels have a correct brightness. Specifically, as the temperature of the pixels change (e.g., due to operation of the panel itself), the current characteristics of the light emitting diodes may change, causing a drift in the brightness of each of the pixels. As such, to correct for the drift in current characteristics, the current being drawn by one or more pixels can be measured to compensate the input provided to each of the pixels.

However, the performance of the sensing circuit for measuring the current characteristics of the electronic circuit may also drift as the operating conditions of the electronic system changes. For example, amplifiers used for amplifying the signals outputted by the electronic system before being senses may contain electronic components (such as resistors) with characteristics that may be dependent on operating temperature. Thus, the gain of the amplifier circuit may also change as the temperature of the electronic system and the amplifier changes. As such, it would be advantageous to reduce the operating condition (e.g., temperature) dependence of the sensing circuitry for sensing the electrical characteristics of electronic systems.

SUMMARY

Embodiments relate to a circuit implementation for sensing electrical characteristics (e.g., current or voltage) of an electronic system. The sensing circuit includes at least a first gain stage and a controller for controlling the operation of the first gain stage. In some embodiments, the sensing circuit additionally includes a second gain stage coupled to the output of the first gain stage. The first gain stage includes a differential amplifier having at least a first input and a first output, and a feedback loop coupled between the first input and the first output of the amplifier. The feedback loop includes a first capacitor coupled between the first input and the first output of the differential amplifier, and a second capacitor having a first terminal coupled to the first input of the differential amplifier through a first switch and a second terminal coupled to the first output of the differential amplifier through a second switch. Moreover, the first terminal of the second capacitor is coupled to a supply voltage through a third switch, and the second terminal of the capacitor is coupled to the supply voltage through a fourth switch.

Figure 1:
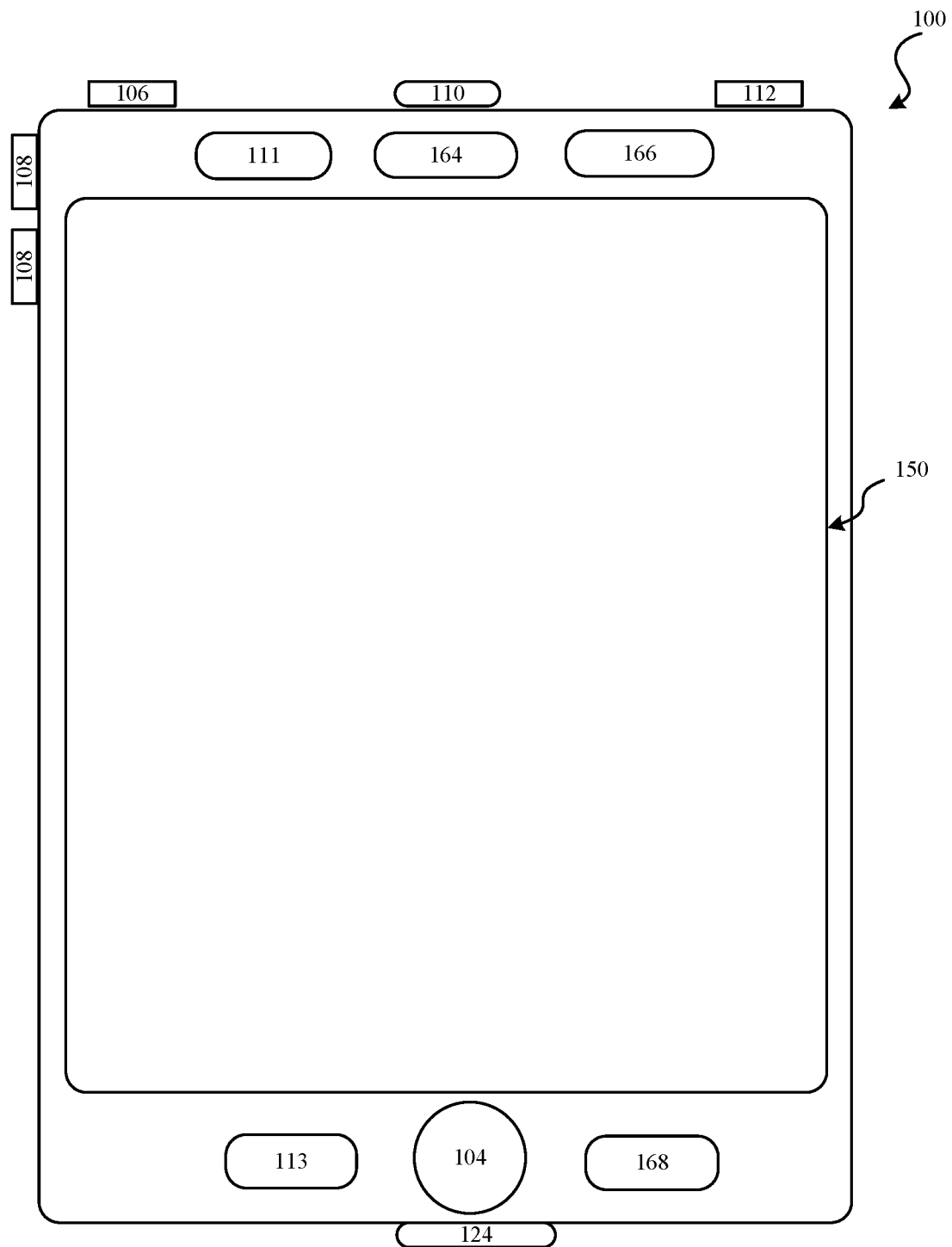
FIG. 1 is a high-level diagram of an electronic device, according to one or more embodiments.

The figures depict, and the detail description describes, various non-limiting embodiments for purposes of illustration only.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, the described embodiments may be practiced without these specific details. In other instances, well-known methods, procedures, components, circuits, and networks have not been described in detail so as not to unnecessarily obscure aspects of the embodiments.

Embodiments relate to a circuit implementation for sensing electrical characteristics (e.g., current or voltage) of an electronic system. The sensing circuit includes a current measurement circuit configured to generate an output voltage based on an input current. In some embodiments, the sensing circuit additionally includes a second gain stage coupled to the output of current measurement circuit for further amplifying the output of the current measurement circuit. Moreover, the sensing circuit includes a voltage measurement circuit configured to generate an output voltage based on an input voltage. The sensing circuit may multiplex the current sensing circuit and the voltage sensing circuit to enable the sensing circuit to be used to measure a current level or a voltage level of an electronic component of an electronic circuit.

The current sensing circuit includes a differential amplifier and a feedback loop coupled between an input and an output of the differential amplifier. The feedback loop includes a first capacitor coupled between the input and the output of the differential amplifier, and a second capacitor coupled in parallel to the first capacitor through a set of switches. In some embodiments, during a first portion of a measurement cycle, the first and second switches are closed. As such, during the first portion of the measurement cycle, the second capacitor is connected in parallel with the first capacitor. During a second portion of the measurement cycle, the first and second switches are opened. As such, during the second portion of the measurement cycle, the second capacitor is disconnected from the differential amplifier. During the second portion of the measurement cycle, the second capacitor may be discharged. During the first portion of the measurement cycle, a portion of the charge stored by the first capacitor is transferred to the discharged second capacitor. By charging and discharging the capacitors, an oscillating output may be generated. The oscillating output can then be sensed and the input of the current sensing circuit (e.g., input current) can be determined by determining an average of the osculating output. Moreover, by using capacitors in the feedback loop (e.g., instead of using resistors) the temperature dependency of the current sensing circuit can be decreased.

Exemplary Electronic Device

Embodiments of electronic devices, user interfaces for such devices, and associated processes for using such devices are described. In some embodiments, the device is a portable communications device, such as a mobile telephone, that also contains other functions, such as personal digital assistant (PDA) and/or music player functions. Exemplary embodiments of portable multifunction devices include, without limitation, the iPhone®, iPod Touch®, Apple Watch®, and iPad® devices from Apple Inc. of Cupertino, Calif. Other portable electronic devices, such as wearables, laptops or tablet computers, are optionally used. In some embodiments, the device is not a portable communications device, but is a desktop computer or other computing device that is not designed for portable use. In some embodiments, the disclosed electronic device may include a touch sensitive surface (e.g., a touch screen display and/or a touch pad). An example electronic device described below in conjunction with FIG. 1 (e.g., device 100) may include a touch-sensitive surface for receiving user input. The electronic device may also include one or more other physical user-interface devices, such as a physical keyboard, a mouse and/or a joystick.

FIG. 1 is a high-level diagram of an electronic device 100, according to one or more embodiments. Device 100 may include one or more physical buttons, such as a "home" or menu button 104. Menu button 104 is, for example, used to navigate to any application in a set of applications that are executed on device 100. In some embodiments, menu button 104 includes a fingerprint sensor that identifies a fingerprint on menu button 104. The fingerprint sensor may be used to determine whether a finger on menu button 104 has a fingerprint that matches a fingerprint stored for unlocking device 100. Alternatively, in some embodiments, menu button 104 is implemented as a soft key in a graphical user interface (GUI) displayed on a touch screen.

In some embodiments, device 100 includes touch screen 150, menu button 104, push button 106 for powering the device on/off and locking the device, volume adjustment buttons 108, Subscriber Identity Module (SIM) card slot 110, head set jack 112, and docking/charging external port 124. Push button 106 may be used to turn the power on/off on the device by depressing the button and holding the button in the depressed state for a predefined time interval; to lock the device by depressing the button and releasing the button before the predefined time interval has elapsed; and/or to unlock the device or initiate an unlock process. In an alternative embodiment, device 100 also accepts verbal input for activation or deactivation of some functions through microphone 113. The device 100 includes various components including, but not limited to, a memory (which may include one or more computer readable storage mediums), a memory controller, one or more central processing units (CPUs), a peripherals interface, an RF circuitry, an audio circuitry, speaker 111, microphone 113, input/output (I/O) subsystem, and other input or control devices. Device 100 may include one or more image sensors 164, one or more proximity sensors 166, and one or more accelerometers 168. The device 100 may include components not shown in FIG. 1.

Device 100 is only one example of an electronic device, and device 100 may have more or fewer components than listed above, some of which may be combined into a component or have a different configuration or arrangement. The various components of device 100 listed above are embodied in hardware, software, firmware or a combination thereof, including one or more signal processing and/or application specific integrated circuits (ASICs). Device 100 may include one or more current sense circuits described herein.

Figure 2:
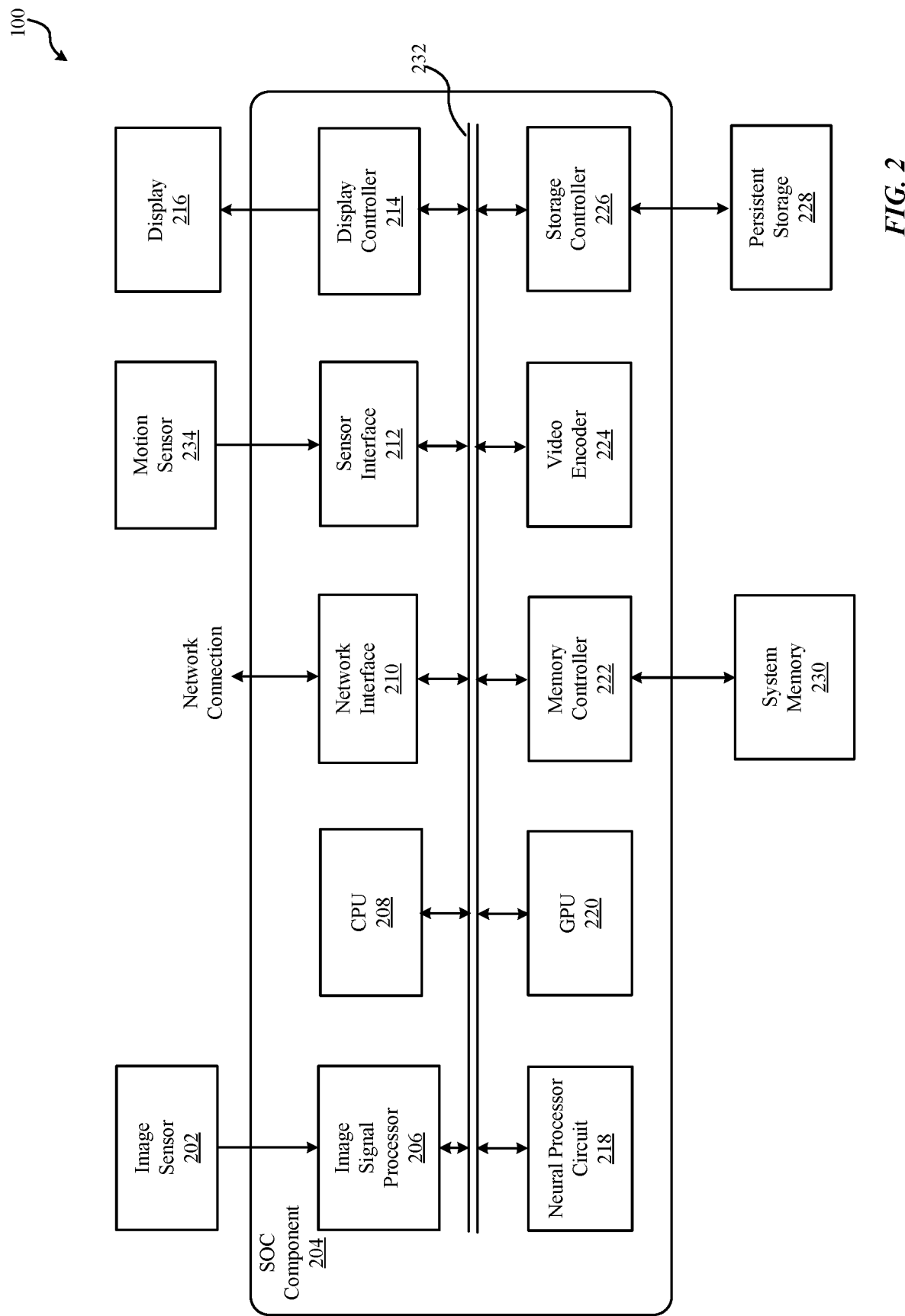
FIG. 2 is a block diagram illustrating components in the electronic device, according to one or more embodiments.

FIG. 2 is a block diagram illustrating components in device 100, according to one or more embodiments. Device 100 may perform various operations including implementing one or more machine learning models. For this and other purposes, device 100 may include, among other components, image sensors 202, a system-on-a chip (SOC) component 204, a system memory 230, a persistent storage (e.g., flash memory) 228, a motion sensor 234, and a display 216. The components as illustrated in FIG. 2 are merely illustrative. For example, device 100 may include other components (such as speaker or microphone) that are not illustrated in FIG. 2. Further, some components (such as motion sensor 234) may be omitted from device 100.

Image sensors 202 are components for capturing image data and may be embodied, for example, as a complementary metal-oxide-semiconductor (CMOS) active-pixel sensor, a camera, video camera, or other devices. Image sensors 202 generate raw image data that is sent to SOC component 204 for further processing. In some embodiments, the image data processed by SOC component 204 is displayed on display 216, stored in system memory 230, persistent storage 228 or sent to a remote computing device via network connection. The raw image data generated by image sensors 202 may be in a Bayer color kernel array (CFA) pattern.

Motion sensor 234 is a component or a set of components for sensing motion of device 100. Motion sensor 234 may generate sensor signals indicative of orientation and/or acceleration of device 100. The sensor signals are sent to SOC component 204 for various operations such as turning on device 100 or rotating images displayed on display 216.

Display 216 is a component for displaying images as generated by SOC component 204. Display 216 may include, for example, liquid crystal display (LCD) device or an organic light-emitting diode (OLED) device. Based on data received from SOC component 204, display 216 may display various images, such as menus, selected operating parameters, images captured by image sensors 202 and processed by SOC component 204, and/or other information received from a user interface of device 100 (not shown).

System memory 230 is a component for storing instructions for execution by SOC component 204 and for storing data processed by SOC component 204. System memory 230 may be embodied as any type of memory including, for example, dynamic random access memory (DRAM), synchronous DRAM (SDRAM), double data rate (DDR, DDR2, DDR3, etc.) RAMBUS DRAM (RDRAM), static RAM (SRAM) or a combination thereof.

Persistent storage 228 is a component for storing data in a non-volatile manner. Persistent storage 228 retains data even when power is not available. Persistent storage 228 may be embodied as read-only memory (ROM), flash memory or other non-volatile random access memory devices. Persistent storage 228 stores an operating system of device 100 and various software applications. Persistent storage 228 may also store one or more machine learning models, such as regression models, random forest models, support vector machines (SVMs) such as kernel SVMs, and artificial neural networks (ANNs) such as convolutional network networks (CNNs), recurrent network networks (RNNs), autoencoders, and long short term memory (LSTM). A machine learning model may be an independent model that works with the neural processor circuit 218 and various software applications or sensors of device 100. A machine learning model may also be part of a software application. The machine learning models may perform various tasks such as facial recognition, image classification, object, concept, and information classification, speech recognition, machine translation, voice recognition, voice command recognition, text recognition, text and context analysis, other natural language processing, predictions, and recommendations.

Various machine learning models stored in device 100 may be fully trained, untrained, or partially trained to allow device 100 to reinforce or continue to train the machine learning models as device 100 is used. Operations of the machine learning models include various computation used in training the models and determining results in runtime using the models. For example, in one case, device 100 captures facial images of the user and uses the images to continue to improve a machine learning model that is used to lock or unlock the device 100.

SOC component 204 is embodied as one or more integrated circuit (IC) chip and performs various data processing processes. SOC component 204 may include, among other subcomponents, image signal processor (ISP) 206, a central processor unit (CPU) 208, a network interface 210, sensor interface 212, display controller 214, neural processor circuit 218, graphics processor (GPU) 220, memory controller 222, video encoder 224, storage controller 226, and bus 232 connecting these subcomponents. SOC component 204 may include more or fewer subcomponents than those shown in FIG. 2.

ISP 206 is a circuit that performs various stages of an image processing pipeline. In some embodiments, ISP 206 may receive raw image data from image sensors 202, and process the raw image data into a form that is usable by other subcomponents of SOC component 204 or components of device 100. ISP 206 may perform various image-manipulation operations such as image translation operations, horizontal and vertical scaling, color space conversion and/or image stabilization transformations.

CPU 208 may be embodied using any suitable instruction set architecture, and may be configured to execute instructions defined in that instruction set architecture. CPU 208 may be general-purpose or embedded processors using any of a variety of instruction set architectures (ISAs), such as the x86, PowerPC, SPARC, RISC, ARM or MIPS ISAs, or any other suitable ISA. Although a single CPU is illustrated in FIG. 2, SOC component 204 may include multiple CPUs. In multiprocessor systems, each of the CPUs may commonly, but not necessarily, implement the same ISA.

Graphics processing unit (GPU) 220 is graphics processing circuitry for performing graphical data. For example, GPU 220 may render objects to be displayed into a frame buffer (e.g., one that includes pixel data for an entire frame). GPU 220 may include one or more graphics processors that may execute graphics software to perform a part or all of the graphics operation, or hardware acceleration of certain graphics operations.

Neural processor circuit 218 is a circuit that performs various machine learning operations based on computation including multiplication, addition, and accumulation. Such computation may be arranged to perform, for example, various types of tensor multiplications such as tensor product and convolution of input data and kernel data. Neural processor circuit 218 is a configurable circuit that performs these operations in a fast and power-efficient manner while relieving CPU 208 of resource-intensive operations associated with neural network operations. Neural processor circuit 218 may receive the input data from sensor interface 212, the image signal processor 206, persistent storage 228, system memory 230 or other sources such as network interface 210 or GPU 220. The output of neural processor circuit 218 may be provided to various components of device 100 such as image signal processor 206, system memory 230 or CPU 208 for various operations.

Network interface 210 is a subcomponent that enables data to be exchanged between devices 100 and other devices via one or more networks (e.g., carrier or agent devices). For example, video or other image data may be received from other devices via network interface 210 and be stored in system memory 230 for subsequent processing (e.g., via a back-end interface to image signal processor 206) and display. The networks may include, but are not limited to, Local Area Networks (LANs) (e.g., an Ethernet or corporate network) and Wide Area Networks (WANs). The image data received via network interface 210 may undergo image processing processes by ISP 206.

Sensor interface 212 is circuitry for interfacing with motion sensor 234. Sensor interface 212 receives sensor information from motion sensor 234 and processes the sensor information to determine the orientation or movement of device 100.

Display controller 214 is circuitry for sending image data to be displayed on display 216. Display controller 214 receives the image data from ISP 206, CPU 208, graphic processor or system memory 230 and processes the image data into a format suitable for display on display 216.

Memory controller 222 is circuitry for communicating with system memory 230. Memory controller 222 may read data from system memory 230 for processing by ISP 206, CPU 208, GPU 220 or other subcomponents of SOC component 204. Memory controller 222 may also write data to system memory 230 received from various subcomponents of SOC component 204.

Video encoder 224 is hardware, software, firmware or a combination thereof for encoding video data into a format suitable for storing in persistent storage 228 or for passing the data to network interface w10 for transmission over a network to another device.

In some embodiments, one or more subcomponents of SOC component 204 or some functionality of these subcomponents may be performed by software components executed on neural processor circuit 218, ISP 206, CPU 208 or GPU 220. Such software components may be stored in system memory 230, persistent storage 228 or another device communicating with device 100 via network interface 210.

Image data or video data may flow through various data paths within SOC component 204. In one example, raw image data may be generated from image sensors 202 and processed by ISP 206, and then sent to system memory 230 via bus 232 and memory controller 222. After the image data is stored in system memory 230, it may be accessed by video encoder 224 for encoding or by display 216 for displaying via bus 232.

In another example, image data is received from sources other than image sensors 202. For example, video data may be streamed, downloaded, or otherwise communicated to the SOC component 204 via wired or wireless network. The image data may be received via network interface 210 and written to system memory 230 via memory controller 222. The image data may then be obtained by ISP 206 from system memory 230 and processed through one or more image processing pipeline stages. The image data may then be returned to system memory 230 or be sent to video encoder 224, display controller 214 (for display on display 216), or storage controller 226 for storage at persistent storage 228.

Example Dual-Mode Amplifier Circuit

Figure 3:
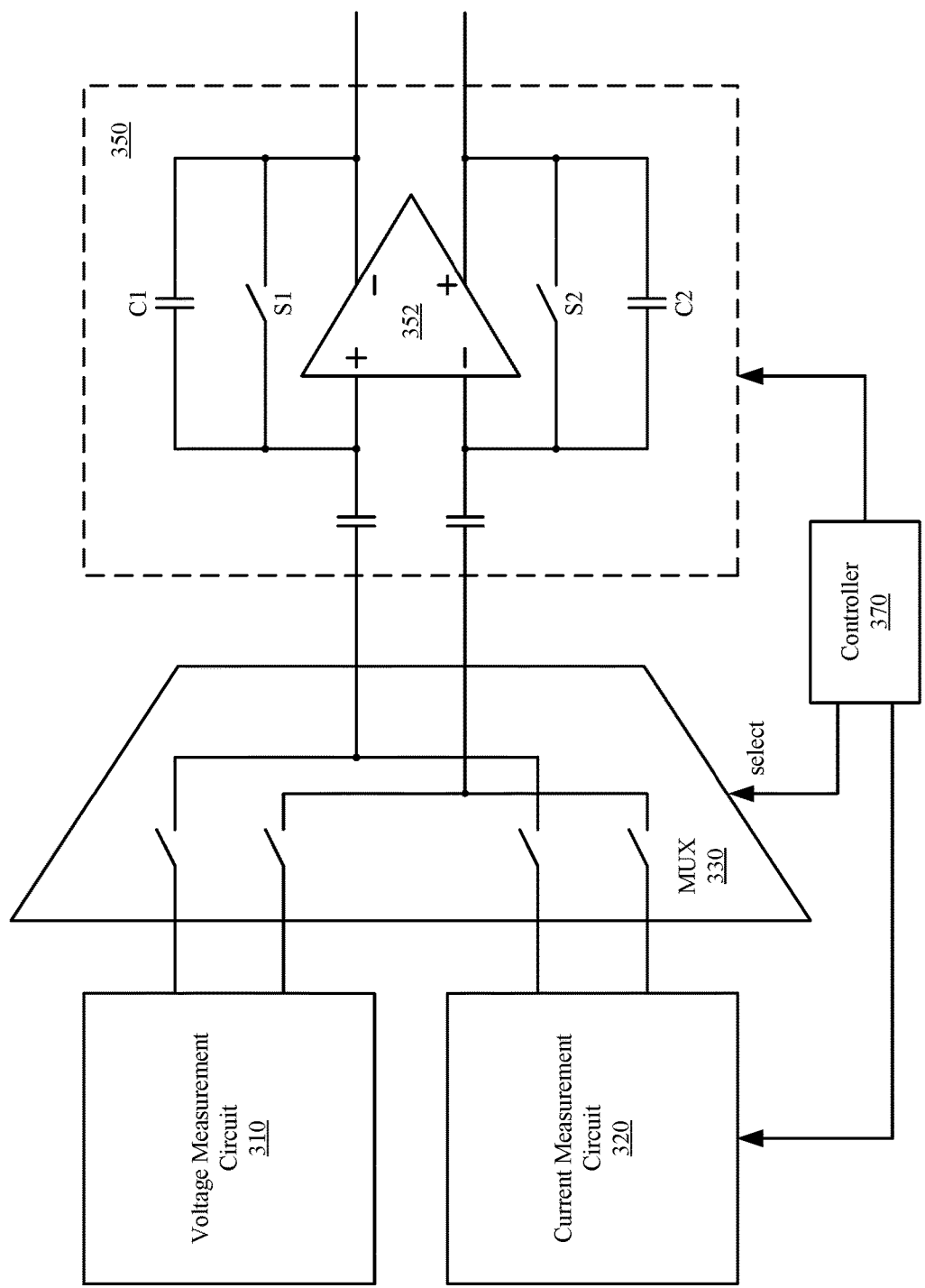
FIG. 3 illustrates a block diagram of a dual-mode amplifier circuit, according to one or more embodiments.

FIG. 3 illustrates a block diagram of a dual-mode amplifier circuit 300, according to one or more embodiments. The dual-mode amplifier circuit 300 includes a voltage measurement circuit 310, a current measurement circuit 320, a multiplexer 330, and a second stage amplifier 350. In some embodiments, the dual-mode amplifier circuit 300 further includes a controller 370. The dual-mode amplifier circuit 300 may include additional, fewer, or different components than the ones shown in FIG. 3.

The voltage measurement circuit 310 is configured to receive a voltage signal as an input and generate an amplified version of the voltage signal. A more detailed description of the voltage measurement circuit 310 is provided below in conjunction with FIG. 4. The current measurement circuit 320 is configured to receive a current signal as an input and generate an output by amplifying the input current based on a gain setting. A more detailed description of the voltage measurement circuit 320 is provided below in conjunction with FIG. 5A.

The multiplexer 330 includes a first set of inputs for receiving a set of outputs of the voltage measurement circuit 310, and a second set of inputs for receiving a set of outputs of the current measurement circuit 320. The multiplexer 330 is configured to connect the first set of inputs to a set of outputs when a select signal has a first value, and is configured to connect the second set of inputs to the set of outputs when the select signal has a second value. As such, the multiplexer 330 propagates either the outputs of the voltage measurement circuit 310 or the outputs of the current measurement circuit 320 based on the value of the select signal.

The second stage 350 includes a set of inputs coupled to the set of outputs of the multiplexer 330. As such, the second stage 350 receives either the output of the voltage measurement circuit 310 or the output of the current measurement circuit 320 based on the value of the select signal. The second stage 350 is configured to generate an output signal by amplifying the received input signals.

In some embodiments, the second stage 350 includes a differential amplifier 352 having a first input connected to a first output of the multiplexer 330, a second input connected to a second output of the multiplexer 330, a first output, and a second output. Moreover, the second stage 350 includes a first capacitor C1 coupled between the first input and the first output of the differential amplifier 352, a first switch S1 coupled between the first input and the first output of the differential amplifier 352, a second capacitor C2 coupled between the second input and the second output of the differential amplifier 352, and a second switch S2 coupled between the second input and the second output of the differential amplifier 352. In some embodiments, the first and second switches S1, S2 are configured to short an input of the differential amplifier 352 to a corresponding output of the differential amplifier 352. Furthermore, the first and second switches S1, S2 may be configured to discharge the first and second capacitors C1, C2 of the second stage 350. In some embodiments, the first capacitor C1 and the second capacitor C2 are tunable to adjust the gain of the second stage 350.

In some embodiments, other implementations of the second gain stage 350 may be used in the dual-mode amplifier circuit 300. For example, instead of using feedback loops implemented using capacitors, the second gain stage 350 may be implemented using resistive feedback loops (i.e., feedback loops implemented using one or more resistors). Alternatively, the second gain stage 350 may be implemented using feedback loops having a combination of one or more resistors and one or more capacitors.

The controller 370 is configured to generate control signals for controlling the voltage measurement circuit 310, the current measurement circuit 320, the multiplexer 330, and the second stage 350. The various control signals generated by the controller 370 are described below in conjunction with more detailed descriptions of each of the components of the dual-mode amplifier circuit 300.

Example Voltage Measuring Circuit

Figure 4:
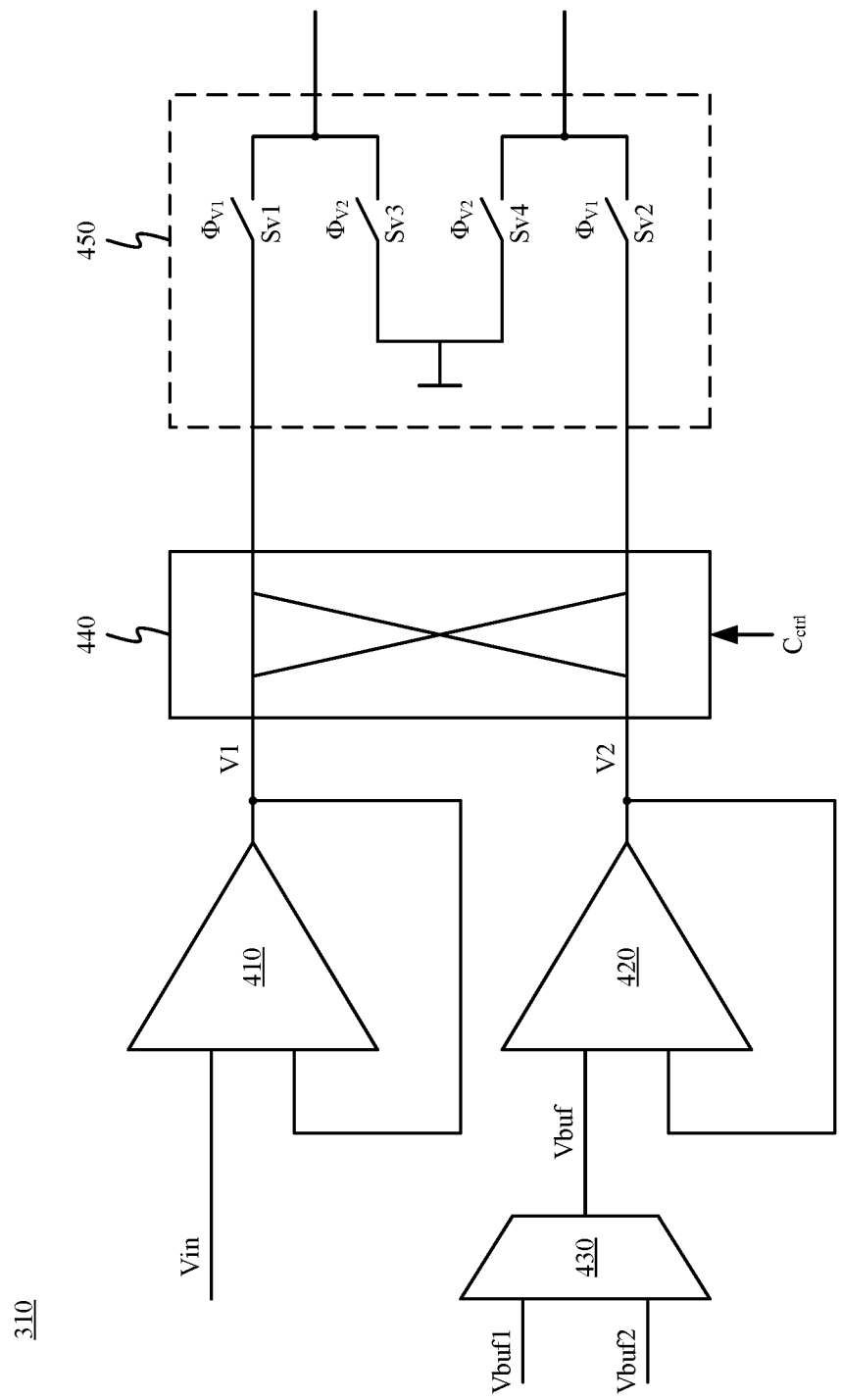
FIG. 4 illustrates a schematic diagram of a voltage measurement circuit, according to one or more embodiments.

FIG. 4 illustrates a schematic diagram of a voltage measurement circuit 310, according to one or more embodiments. The voltage measurement circuit 310 includes a first amplifier 410, a second amplifier 420, a multiplexer 430, a chopper 440, and an output isolation circuit 450. In some embodiments, the voltage measurement circuit 310 includes additional, fewer, or different components than the ones shown in FIG. 4.

The first amplifier 410 receives as a first input an input voltage Vin and outputs a first voltage V1. In some embodiments, the first amplifier 410 is configured to amplify the input voltage Vin by a specified gain value. Moreover, the first amplifier 410 may include a second input coupled to the output of the first amplifier 410. Moreover, the output of the first amplifier 410 is coupled to a first input of the chopper 440.

The second amplifier 420 receives a first buffer voltage Vbuff and outputs a second voltage V2. In some embodiments, the second amplifier 420 is configured to amplify the buffer voltage Vbuff by a specified gain value. Moreover, the first amplifier 410 and the second amplifier 420 may be configured to have the same (or substantially the same) gain. The second amplifier 420 has a first input coupled to an output of the multiplexer 430. The multiplexer 430 receives as inputs a set of test voltages or reference voltages. Moreover, the second amplifier 420 may include a second input coupled to the output of the second amplifier 420. Moreover, the output of the second amplifier 420 is coupled to a second input of the chopper 440.

The chopper 440 includes a first input coupled to the output the first amplifier 410, a second input coupled to the output of the second amplifier 420, a first output, and a second output. In some embodiments, the chopper 440 receives a chopper control signal Cctrl. If the chopper control signal Cctrl has a first value, the chopper 440 connects the first input of the chopper 440 to the first output of the chopper 440, and connects the second input of the chopper 440 to the second output of the chopper 440. That is, the chopper 440 connects the output of the first amplifier 410 to the first output of the chopper 440, and connects the output of the second amplifier 420 to the second output of the chopper 440. Alternatively, if the chopper control signal Cctrl has a second value, the chopper 440 connects the first input of the chopper 440 to the second output of the chopper 440, and connects the second input of the chopper 440 to the first output of the chopper 440. That is, the chopper 440 connects the output of the first amplifier 410 to the second output of the chopper 440, and connects the output of the second amplifier 420 to the first output of the chopper 440.

The isolation circuit 450 is configured to isolate the voltage measurement circuit 310 from the rest of the circuit in response to receiving an isolation control signal. Specifically, the isolation circuit 450 includes a first switch Sv1 coupled between a first output of the chopper 440 and a first output terminal of the voltage measurement circuit, and a second switch Sv2 coupled between a second output of the chopper 440 and a second output terminal of the voltage measurement circuit. In some embodiments, the isolation circuit 450 includes a third switch Sv3 coupled between the first output terminal of the voltage measurement circuit 310 and a supply voltage, and a fourth switch Sv4 coupled between the second output terminal of the voltage measurement circuit 310 and the supply voltage.

In some embodiments, the first and second switches of the isolation circuit 450 are controlled by a first isolation control signal $\Phi v1$, and the third and fourth switches of the isolation circuit 450 are controlled by a second isolation control signal $\Phi v2$. In some embodiments, the second isolation control signal $\Phi v1$ is the inverse of the first isolation control signal $\Phi v2$. In some embodiments, the first isolation control signal $\Phi v1$ and the second isolation control signal $\Phi v2$ are generated by the controller 370 shown in FIG. 3.

Example Current Measuring Circuit

Figure 5A:
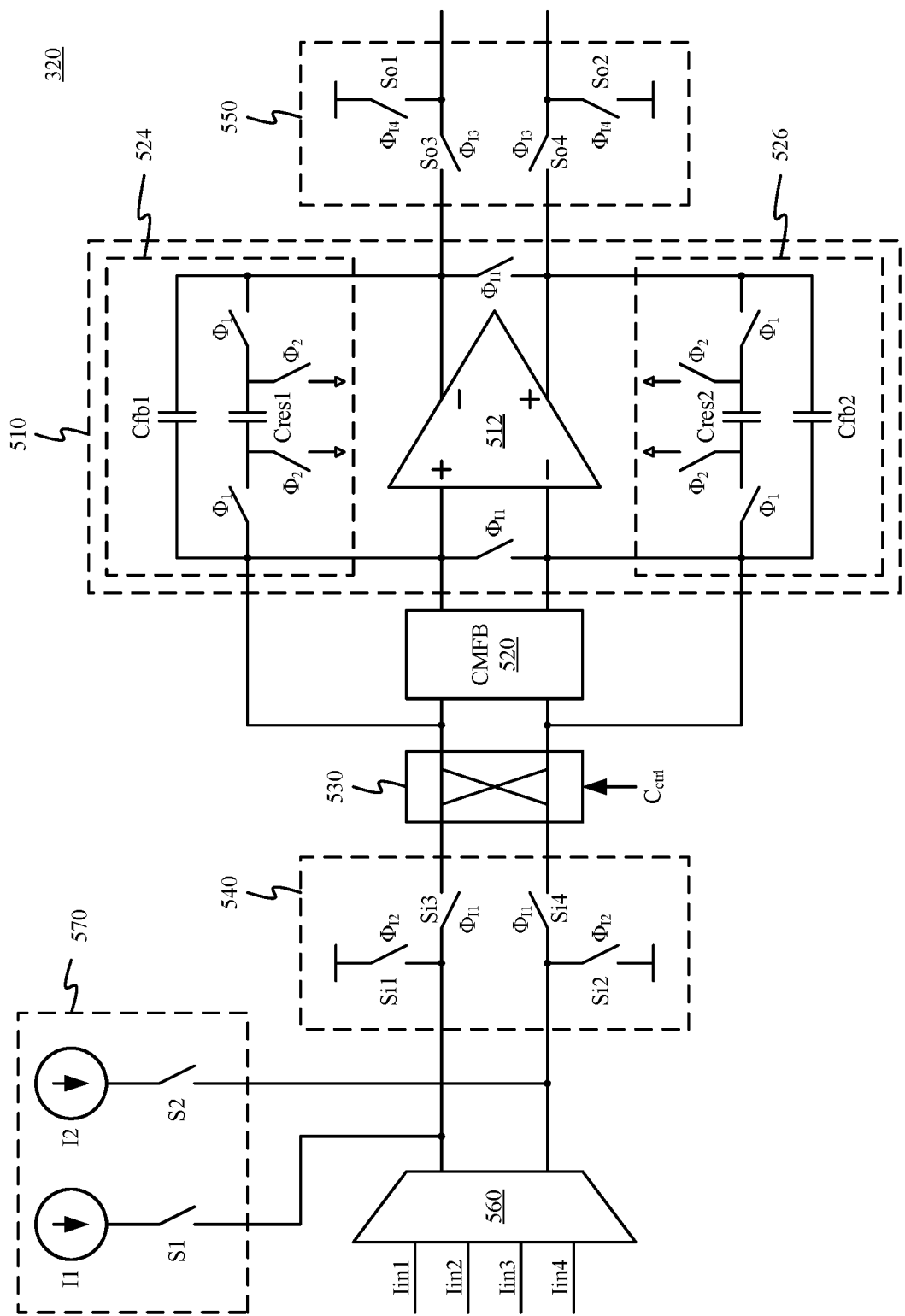
FIG. 5A illustrates a schematic diagram of a current measurement circuit 320, according to one or more embodiments.

FIG. 5A illustrates a schematic diagram of a current measurement circuit 320, according to one or more embodiments. The current measurement circuit 320 includes a gain stage 510, a current mode feedback (CMFB) circuit 520, a chopper 530, an input isolation circuit 540, and output isolation circuit 550, an input multiplexer 560, and a calibration current generation circuit 570. In some embodiments, the current measurement circuit 320 additionally includes a current generation circuit 370, a bias voltage generation circuit, and a common mode voltage (VCM) generation circuit. In some embodiments, the current measurement circuit 320 includes additional, fewer, or different components than the ones shown in FIG. 5A.

Figure 5B:
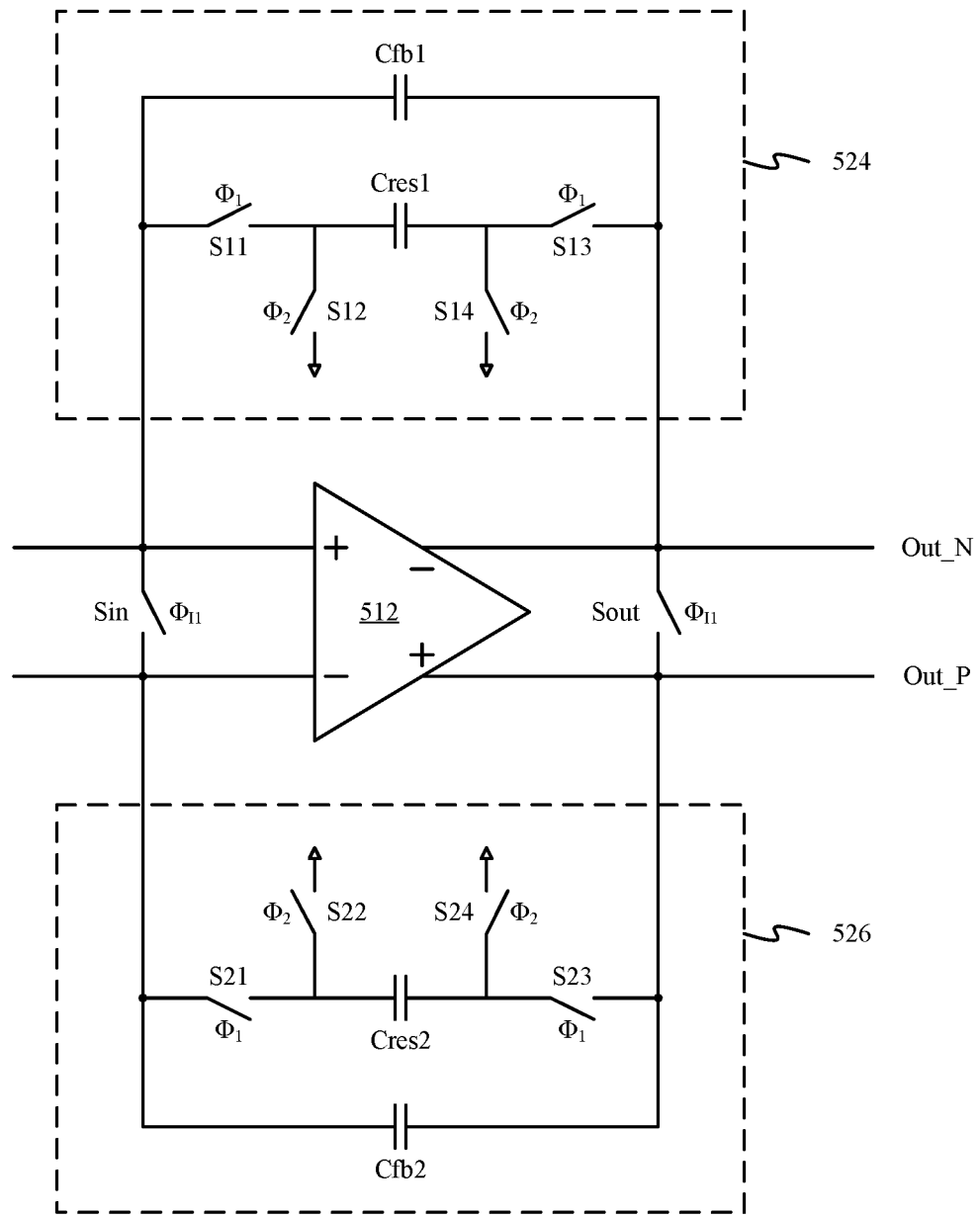
FIG. 5B illustrates a more detailed schematic diagram of the gain stage, according to one or more embodiments.

The gain stage 510 includes a differential amplifier 512, a first feedback loop 524, and a second feedback loop 526. In some embodiments, the gain stage 510 additionally includes an input switch Sin and an output switch Sout. FIG. 5B illustrates a more detailed schematic diagram of the gain stage 510, according to one or more embodiments. In some embodiments, the gain stage 510 includes additional, fewer, or different component than the ones shown in FIGS. 5A and 5B.

The differential amplifier 512 receives a set of input currents and outputs a set of output voltages based on the current level of the set of input currents. In some embodiments, the set of output voltages of the differential amplifier are generated by amplifying the set of input currents by a set gain value. The differential amplifier 512 includes a first input terminal, a second input terminal, a first output terminal, and a second output terminal. The first input terminal and the second input terminal are configured to receive a differential input signal. In some embodiments, the first input terminal is a positive (+) input terminal and the second input terminal is a negative (−) input terminal. The first output terminal and the second output terminal are configured to provide a differential output signal. In some embodiments, the first output signal is a negative (−) output terminal and the second output terminal is a positive (+) output terminal.

The first feedback loop 524 is coupled between the first input terminal and the first output terminal of the differential amplifier 512. In some embodiments, the first feedback loop 524 is coupled between the positive input terminal and the negative output terminal of the differential amplifier 512. The first feedback loop 524 includes a first capacitor Cfb1 and a second capacitor Cres1. The first capacitor Cfb1 has a first terminal coupled to an input of the first feedback loop and a second terminal coupled to an output of the first feedback loop.

The second capacitor Cres1 has a first terminal coupled to the input of the first feedback loop through a first switch S11 and to ground (or a supply voltage) through a second switch S12. Moreover, the second capacitor Cres1 has a second terminal coupled to the output of the first feedback loop through a third switch S13 and to ground (or a supply voltage) through a fourth switch S14. That is, the first switch S11 has a first terminal coupled to the first terminal of the second capacitor Cres1 and a second terminal coupled to the input of the first feedback loop, the second switch S12 has a first terminal coupled to the first terminal of the second capacitor Cres1 and a second terminal coupled to ground, the third switch S13 has a first terminal coupled to the second terminal of the second capacitor Cres1 and a second terminal coupled to the output of the first feedback loop, and the fourth switch S14 has a first terminal coupled to the second terminal of the second capacitor Cres1 and a second terminal coupled to ground.

In some embodiments, the first switch S11 and the third switch S13 are controlled by a first control signal 1. For example, the first switch S11 and the third switch S13 are configured to be in the closed position when the first control signal $\Phi 1$ has a first level (on level), and are configured to be in the open position when the first control signal $\Phi 1$ has a second level (off level). Moreover, the second switch S12 and the fourth switch S14 are controlled by a second control signal $\Phi 2$. For example, the second switch S12 and the fourth switch S14 are configured to be in the closed position when the second control signal $\Phi 2$ has the first level (on level), and are configured to be in the open position when the second control signal $\Phi 2$ has the second level (off level). As such, when the first control signal has the first level and the second control signal has the second level, the second capacitor Cres1 is connected in parallel with the first capacitor Cfb1. In addition, when the first control signal has the second level and the first control signal; has the first level, the second capacitor Cres1 is discharged to ground (or discharged to a reference voltage or supply voltage level).

Thus, when the first control signal $\Phi 1$ has the first level and the second control signal $\Phi 2$ has the second level, the first feedback loop 524 has a capacitance of:

$$C_{FB}=Cfb1+Cres1 \tag{1}$$

In addition, when the first control signal $\Phi 1$ has the second level and the second control signal $\Phi 2$ has the first level, the first feedback loop 524 has a capacitance of:

$$C_{FB}=Cfb1 \tag{2}$$

Moreover, when the first control signal Φ1 switches from the second level to the first level (i.e., when the first switch S11 and the third switch S13 are closed) and the second control signal Φ2 switches from the first level to the second level (i.e., the second switch S12 and the fourth switch S14 are opened), the first capacitor Cfb1 is partially discharged. That is, a portion of the charged stored in the first capacitor Cfb1 is transferred to the discharged second capacitor Cres1.

The second feedback loop 526 is coupled between the second input terminal and the second output terminal of the differential amplifier 512. In some embodiments, the second feedback loop 526 is coupled between the negative input terminal and the positive output terminal of the differential amplifier 512. The second feedback loop 526 includes a third capacitor Cfb2 and a fourth capacitor Cres2. The third capacitor Cfb2 has a first terminal coupled to an input of the second feedback loop and a second terminal coupled to an output of the second feedback loop.

The fourth capacitor Cres2 has a first terminal coupled to the input of the second feedback loop through a fifth switch S21 and to ground (or a supply voltage) through a sixth switch S22. Moreover, the fourth capacitor Cres2 has a second terminal coupled to the output of the second feedback loop through a seventh switch S23 and to ground (or a supply voltage) through an eighth switch S24. That is, the fifth switch S21 has a first terminal coupled to the first terminal of the fourth capacitor Cres1 and a second terminal coupled to the input of the second feedback loop, the sixth switch S22 has a first terminal coupled to the first terminal of the fourth capacitor Cres2 and a second terminal coupled to ground, the seventh switch S23 has a first terminal coupled to the second terminal of the fourth capacitor Cres2 and a second terminal coupled to the output of the second feedback loop, and the eighth switch S24 has a first terminal coupled to the second terminal of the fourth capacitor Cres2 and a second terminal coupled to ground.

In some embodiments, the fifth switch S21 and the seventh switch S23 are controlled by the first control signal Φ1. For example, the fifth switch S21 and the seventh switch S23 are configured to be in the closed position when the first control signal Φ1 has the first level (on level), and are configured to be in the open position when the first control signal Φ1 has the second level (off level). Moreover, the sixth switch S22 and the eighth switch S24 are controlled by the second control signal Φ2. For example, the sixth switch S22 and the eighth switch S24 are configured to be in the closed position when the second control signal Φ2 has the first level (on level), and are configured to be in the open position when the second control signal Φ2 has the second level (off level). As such, when the first control signal has the first level and the second control signal has the second level, the fourth capacitor Cres2 is connected in parallel with the third capacitor Cfb2. In addition, when the first control signal has the second level and the first control signal; has the first level, the fourth capacitor Cres2 is discharged to ground (or discharged to a reference voltage or supply voltage level).

Thus, when the first control signal Φ1 has the first level and the second control signal Φ2 has the second level, the second feedback loop 526 has a capacitance of:

$$C_{FB} = Cfb2 + Cres2 \quad (3)$$

In addition, when the first control signal Φ1 has the second level and the second control signal Φ2 has the first level, the second feedback loop 526 has a capacitance of:

$$C_{FB} = Cfb2 \quad (4)$$

Moreover, when the first control signal Φ1 switches from the second level to the first level (i.e., when the fifth switch S21 and the seventh switch S23 are closed) and the second control signal Φ2 switches from the first level to the second level (i.e., the sixth switch S22 and the eighth switch S24 are opened), the third capacitor Cfb2 is partially discharged. That is, a portion of the charged stored in the third capacitor Cfb2 is transferred to the discharged fourth capacitor Cres2.

In some embodiments, the first control signal Φ1 and the second control signal Φ2 are generated by the controller 370 shown in FIG. 3.

In some embodiments, capacitors may have a low temperature dependence (e.g., lower than resistors) across the operating temperatures of the dual-mode amplifier circuit 300. As such, by using capacitors in the first feedback loop 524 and the second feedback loop 526, instead of using resistors, the temperature dependence of the current measurement circuit 320 may be improved (i.e., the temperature dependence of the current measurement circuit 320 may be decreased).

Figure 6A:
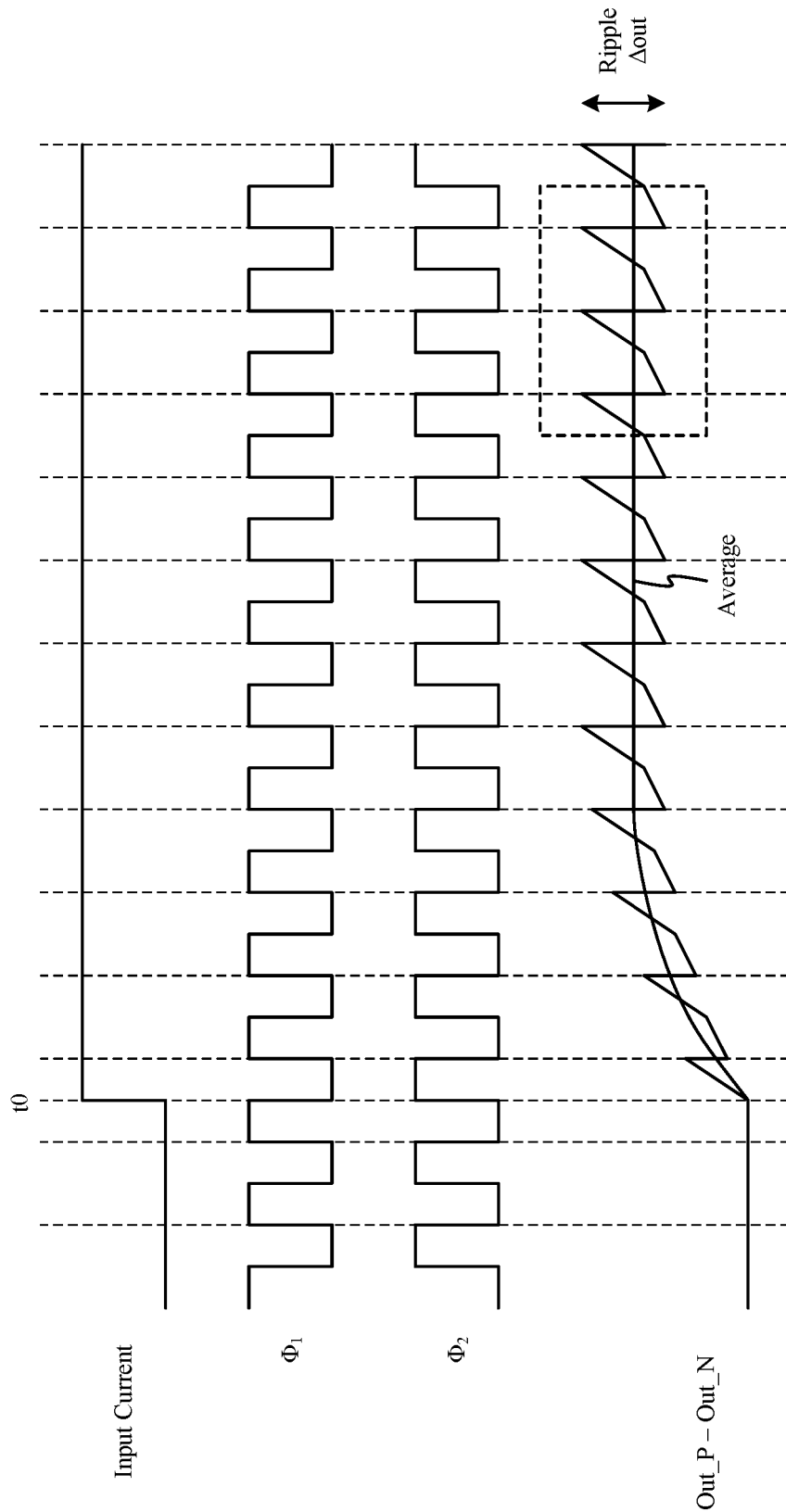
FIG. 6A illustrates a timing diagram of the operation of the gain stage, according to one or more embodiments.
Figure 6B:
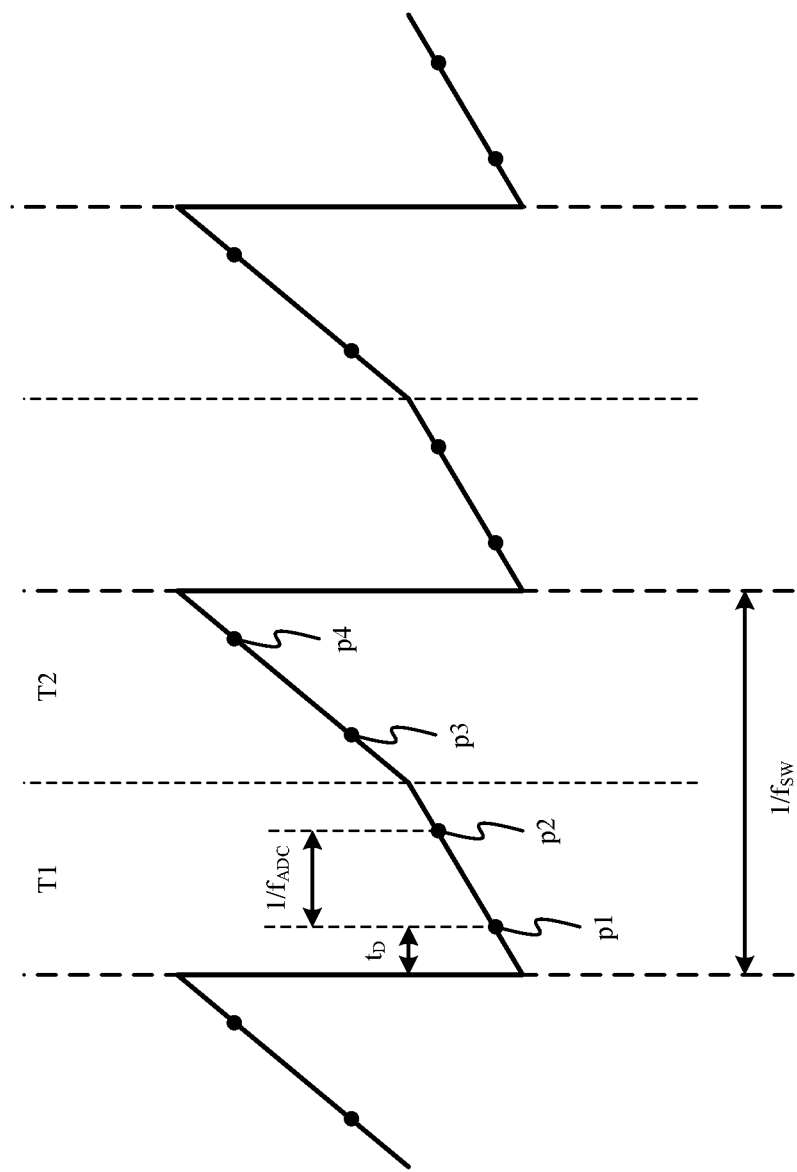
FIG. 6B illustrates a zoomed in view of the plot of the differential output voltage, according to one or more embodiments.

FIG. 6A illustrates a timing diagram of the operation of the gain stage 510, according to one or more embodiments. The timing diagram of FIG. 6A includes a plot of an example input current, a plot of the first control signal Φ1, a plot of the second control signal Φ2, and a plot of the differential output voltage (Out_P−Out_N). FIG. 6B illustrates a zoomed in view of the plot of the differential output voltage, according to one or more embodiments.

In some embodiments, the operation of the gain stage 510 is divided into a set of periods. During each period, the first control signal Φ1 is generated to have a first level during a first portion of the period and a second level during a second portion of the period. That is, the first control signal Φ1 switches back and forth between the first level and the second level. Moreover, during each period, the second control signal Φ2 is generated to have the second level during the first portion of the period and the first level during the second portion of the period. In some embodiments, the second control signal Φ2 is the inverse of the first control signal. In other embodiments, the second control signal switches from the second level (LO or off) to the first level (HI or on) after a set delay from when the first control signal Φ1 switches from the first level to the second level. Moreover, the second control signal may switch from the first level (HI or on) to the second level (LO or off) a set amount of time before the first control signal Φ1 switches from the second level to the first level. This ensures that the first switch S11 and the second switch S12, the third switch S13 and the fourth switch S14, the fifth switch S21 and the sixth switch S22, and the seventh switch S23 and the eighth switch S24 are not on at the same time.

In the example of FIG. 6A, the input current switches from a first current level to a second current level at time t0. When the input current increases in value, the capacitors of the first feedback loop 524 and/or the second feedback loop 526 start charging. For example, in the diagram of FIG. 6A, the input current switches from the first current level to the second current level when the first control signal Φ1 has the second level and the second control signal Φ2 has the first level. As such, since the second capacitor Cres1 and the fourth capacitor Cres2 are disconnected from differential amplifier 512, only the first capacitor Cfb1 and the third capacitor Cfb2 are charged.

Alternatively, the input current may switch from a first current level to a second current level when the first control signal Φ1 has the first level and the second control signal Φ2 has the second level. In this situation, the second capacitor Cres1 and the fourth capacitor Cres2 are connected to the differential amplifier 512. As such, all four capacitors (the first capacitors Cfb1 and the second capacitor Cres1, as well as the third capacitor Cfb2 and the fourth capacitor Cres2) are charged.

In some embodiments, the output voltage increases until the average value of the output voltage reaches an equilibrium or steady state level. However, due to the switching nature of the first feedback loop 524 and the second feedback loop 526, the output of the gain stage 510 fluctuates between two values (e.g., with a ripple Δout).

Figure 6D:
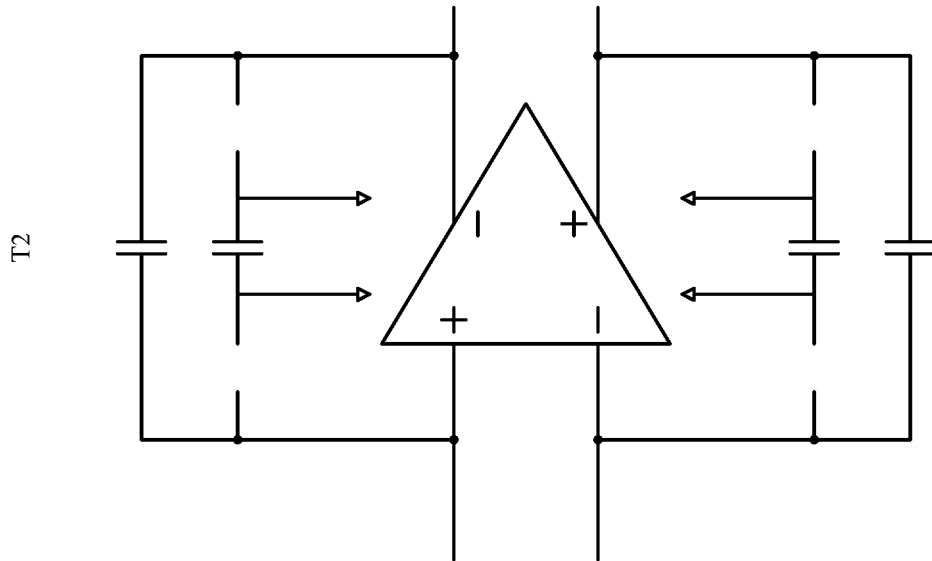
FIG. 6D illustrates the configuration of the gain stage during the second portion of the period, according to one or more embodiment.
Figure 6C:
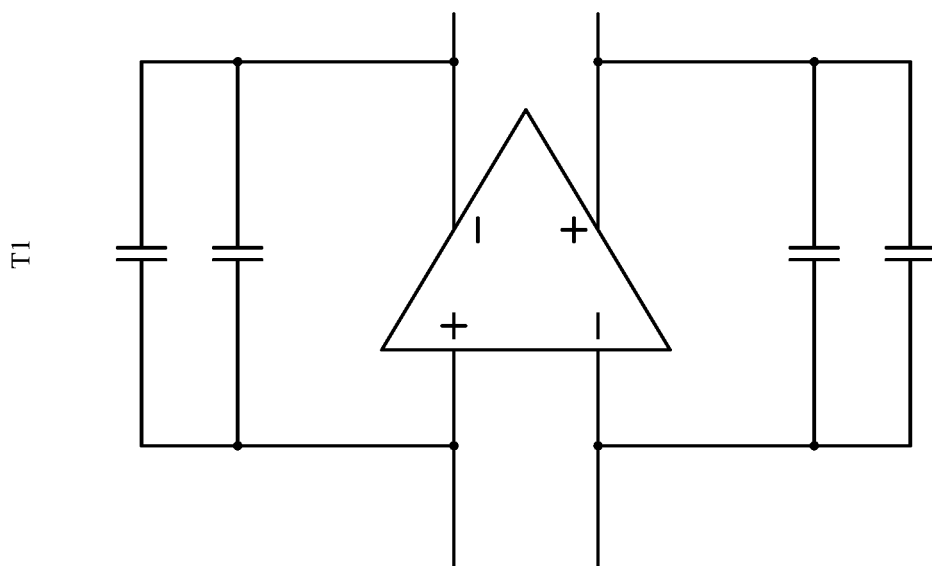
FIG. 6C illustrates the configuration of the gain stage during the first portion of the period, according to one or more embodiments.

As shown in FIG. 6B, the output Out_P–Out_N increases with a first slope during a first portion T1 of a period, and increases with a second slope during a second portion T2 of the period. FIG. 6C illustrates the configuration of the gain stage 510 during the first portion T1 of the period, according to one or more embodiments. FIG. 6D illustrates the configuration of the gain stage 510 during the second portion T2 of the period, according to one or more embodiment.

During the first position T1 of a period, the first control signal Φ1 has a first level and the second control signal Φ2 has a second level. As such, the second capacitor Cres1 is connected in parallel with the first capacitor Cfb1, and the fourth capacitor Cres2 is connected in parallel with the third capacitor Cfb2. As a result, the first feedback loop 524 has an equivalent capacitance of Cfb1+Cres1. Similarly, the second feedback loop 526 has an equivalent capacitance of Cfb2+Cres2.

Thus, during the first portion T1 of a period, the output Out_P–Out_N increases with a slope that is dependent on the equivalent capacitance of the parallel combination of Cfb1 and Cres1, and the parallel combination of Cfb2 and Cres2.

Moreover, during the second portion T2 of a period, the first control signal Φ1 has the second level and the second control signal Φ2 has the first level. As such, the second capacitor Cres1 is disconnected from the first capacitor Cfb1 and the second capacitor Cres1 is connected to ground (or a set voltage supply). Similarly, the fourth capacitor Cres2 is disconnected from the third capacitor Cfb2 and the fourth capacitor Cres2 is connected to ground (or a set voltage supply). As a result, the capacitance of the first feedback loop 524 decreases in value from Cfb1+Cres1 to Cfb1. Similarly, the capacitance of the second feedback loop 526 decreases in value from Cfb2+Cres2 to Cfb2. Since the capacitance of both the first feedback loop 524 and the second feedback loop 526 decreases in value, the slope of the output Out_P–Out_N increases. That is, since the capacitance of the first feedback loop 524 is decreased, the capacitor Cfb1 of the first feedback loop 524 can charge faster than during the first portion T1 of the period. Similarly, since the capacitance of the second feedback loop 526 is decreased, the capacitor Cfb2 of the second feedback loop 526 can charge faster than during the first portion T1 of the period.

Moreover, since the second capacitor Cres1 and the fourth capacitor Cres2 are connected to ground, the second capacitor Cres1 and the fourth capacitor Cres2 are discharged. That is, the charges that were stored during the first portion T1 of the period are discharged to ground.

At the end of the second portion T2 of the period, the first control signal Φ1 is toggled from the second level back to the first level, and the second control signal Φ2 is toggled from the first level back to the second level to start the first portion T1 of the next period. As such, the discharged second capacitor Cres1 is reconnected to the first capacitor Cfb1, and the discharged fourth capacitor Cres2 is reconnected to the third capacitor Cfb2.

Since during the second portion of the period the first capacitor Cfb1 was being charged due to the input current, at the beginning of the next period, the first capacitor holds a given amount of charge. As the second capacitor Cres1 is connected to the first capacitor Cfb1 in parallel, a portion of the charge that was stored in the first capacitor Cfb1 is transferred to the second capacitor Cres1. Specifically, charges are transferred from the first capacitor Cfb1 (thus partially discharging the first capacitor) into the second capacitor Cres1 (thus charging the second capacitor) until the voltage between the first capacitor Cfb1 and the second capacitor Cres1 equalizes.

Similarly, since during the second portion of the period the third capacitor Cfb2 was being charged due to the input current, at the beginning of the next period, the third capacitor holds a given amount of charge. As the fourth capacitor Cres2 is connected to the third capacitor Cfb2 in parallel, a portion of the charge that was stored in the third capacitor Cfb2 is transferred to the fourth capacitor Cres2. Specifically, charges are transferred from the third capacitor Cfb2 (thus partially discharging the third capacitor) into the fourth capacitor Cres2 (thus charging the fourth capacitor) until the voltage between the third capacitor Cfb2 and the fourth capacitor Cres2 equalizes.

Thus, at the beginning of the first portion T1 of the next period, the output Out_P–Out_N drops in value. This process is repeated during each cycle of the operation of the current measuring circuit.

In order to determine the level of the input current, the output Out_P–Out_N is measured multiple times during a single period. For example, as shown in FIG. 6B, the output Out_P–Out_N may be measured a set number of time (e.g., 2 or 4) during the first portion T1 of the period and a set number of times (e.g., 2 or 4) during the second portion T2 of the period. Based on the output measurements, an average output level is determined. Based on the average output level, the level of the input current may be determined.

In some embodiment, the output Out_P–Out_N is sampled at a regular interval. For instance, in the example of FIG. 6B, the output Out_P–Out_N is sampled at a frequency of $f_{ADC}$ (i.e., with a period of $1/f_{ADC}$). Moreover, the output Out_P–Out_N is sample with a delay or offset of $t_D$ from the start of the period.

In some embodiments, the output Out_P–Out_N is sampled using an analog-to-digital converter (ADC). The ADC may operate in a power domain different than the dual-mode amplifier circuit 300. In order to time the sampling points of the ADC to the start of each of the periods of the current measurement circuit 320, a level shifter is used to generate respective clocks from a single source clock signal. That is, the level shifter is used to shift the level of the source clock signal to generate a second clock for controlling the ADC. Since the second clock for controlling the ADC is generated from the same source clock signal used for generating the clock signal for controlling the current measurement circuit 320, the operation of the current measurement circuit 320 and the operation of the ADC can be synchronized. An example implementation of a level shifter is shown in conjunction with FIG. 8.

Referring back to FIG. 5A, the CMFB circuit 520 is coupled to the input of the gain stage 510. In some embodiments, the CMFB circuit 520 includes a first input terminal and a first output terminal coupled to a first input terminal (e.g., positive terminal) of the differential amplifier 512 of the gain stage 510, and a second input terminal and a second output terminal coupled to a second input terminal (e.g., negative terminal) of the differential amplifier 512 of the gain stage 510. In some embodiments, the CMFB circuit 520 is configured to sense a common-mode voltage (e.g., between the first input terminal and second input terminal of the differential amplifier 512 of the gain stage 510) to compensate for a common-mode component of the output of the differential amplifier 512.

The chopper 530 is coupled between a set of outputs of the multiplexer 560 and a set of inputs of the gain stage 510. Specifically, the chopper 530 includes a first input coupled to a first output of the multiplexer 560, a second input coupled to a second output of the multiplex 560, a first output coupled to a first input of the gain stage 510, and a second output coupled to a second input of the gain stage 510. In some embodiments, the chopper 530 is coupled to the set of outputs of the multiplexer 560 through the input isolation circuit 540.

In some embodiments, the chopper 530 receives a chopper control signal Cctrl. If the chopper control signal Cctrl has a first value, the chopper 530 connects the first input of the chopper 530 to the first output of the chopper 530, and connects the second input of the chopper 530 to the second output of the chopper 530. That is, the chopper 530 connects the first output of the multiplexer 560 to the first input of the gain stage 510, and connects the second output of the multiplexer 560 to the second input of the gain stage 510. Alternatively, if the chopper control signal Cctrl has a second value, the chopper 530 connects the first input of the chopper 530 to the second output of the chopper 530, and connects the second input of the chopper 530 to the first output of the chopper 530. That is, the chopper 530 connects the first output of the multiplexer 560 to the second input of the gain stage 510, and connects the second output of the multiplexer 560 to the first input of the gain stage 510.

The input isolation circuit 540 and the output isolation circuit 550 are configured to isolate the gain stage 510 from the rest of the circuit in response to receiving an isolation control signal. Specifically, the input isolation circuit 540 includes a first switch Si1 coupled between a first input terminal and first output terminal of the input isolation circuit 540, and a second switch Si2 coupled between a second input terminal and a second output terminal of the input isolation circuit 540. In some embodiments, the first switch Si1 of the input isolation circuit 540 is coupled to a first input side of the gain stage 510, and the second switch Si2 of the input isolation circuit 540 is coupled to a second input side of the gain stage 510. In some embodiments, the first switch Si1 of the input isolation circuit 540 is coupled between a first input terminal of the chopper 530 and a first output terminal of the multiplexer 560, and the second switch Si2 of the input isolation circuit 540 is coupled between a second input terminal of the chopper 530 and a second output terminal of the multiplexer 560.

In some embodiments, the input isolation circuit 540 includes a third switch Si3 coupled between the first input side of the gain stage 510 and a supply voltage, and a fourth switch Si4 coupled between the second input side of the gain stage 510 and the supply voltage. The third switch Si3 of the input isolation circuit 540 may be coupled between the first input terminal of the input isolation circuit 540 and the supply voltage, and the fourth switch Si4 of the input isolation circuit 540 may be coupled between the second input terminal of the input isolation circuit 540 and the supply voltage.

In some embodiments, the first and second switches of the input isolation circuit 540 are controlled by a first input isolation control signal ΦI1, and the third and fourth switches of the input isolation circuit 540 are controlled by a second input isolation control signal ΦI2. In some embodiments, the second input isolation control signal ΦI2 is the inverse of the first input isolation control signal ΦI1. In some embodiments, the first input isolation control signal ΦI1 and the second input isolation control signal ΦI2 are generated by the controller 370 shown in FIG. 3.

Moreover, the output isolation circuit 550 includes a first switch So1 coupled between a first input terminal and first output terminal of the output isolation circuit 550, and a second switch So2 coupled between a second input terminal and a second output terminal of the output isolation circuit 550. In some embodiments, the first switch So1 of the output isolation circuit 550 is coupled to a first output side of the gain stage 510, and the second switch So2 of the output isolation circuit 550 coupled to a second output side of the gain stage 510. In some embodiments, the first switch So1 of the output isolation circuit 550 is coupled to the first output terminal (e.g., negative output terminal) of the differential amplifier 512 of the gain stage 510, and the second switch So2 of the output isolation circuit 550 is coupled to the second output terminal (e.g., positive output terminal) of the differential amplifier 512 of the gain stage 510.

In some embodiments, the output isolation circuit 550 includes a third switch So3 coupled between the first output side of the gain stage 510 and a supply voltage, and a fourth switch So4 coupled between the second output side of the gain stage 510 and the supply voltage. In some embodiments, the third switch So3 of the output isolation circuit 550 is coupled between the first output terminal of the output isolation circuit 550 and the supply voltage, and the fourth switch So4 of the output isolation circuit 550 is coupled between the second output terminal of the output isolation circuit 550 and the supply voltage.

In some embodiments, the first and second switches of the output isolation circuit 550 are controlled by a first output isolation control signal ΦI3, and the third and fourth switches of the output isolation circuit 550 are controlled by a second output isolation control signal ΦI4. In some embodiments, the second output isolation control signal ΦI3 is the inverse of the first output isolation control signal ΦI4. In some embodiments, the first output isolation control signal ΦI3 and the second output isolation control signal ΦI4 are generated by the controller 370 shown in FIG. 3.

The multiplexer 560 receives a set of inputs and selects a subset of the inputs to provide to the gain stage 510. For example, the multiplexer 560 of FIG. 5A includes four inputs Iin1 through Iin4, and two outputs. However, any other combination of number of inputs and number of outputs is possible. In some embodiments, each input of the multiplexer corresponds to a pixel or set of pixels (e.g., pixels in a row of pixel or tile of pixels) of a display device.

In some embodiments, the multiplexer 560 receives a control signal and selects based on the control signal a one input of the set of inputs to be coupled to the first output and another input of the set of inputs to be coupled to the second output. As such, the current measurement circuit 320 may measure a current from multiple input sources by multiplexing the input of the current measurement circuit 320 according to a predefined scheme.

The calibration current generation circuit 570 generates a set of calibration currents for calibrating a gain of the current measuring circuit 320. The calibration current generation circuit 570 includes a first controllable current source I1 and a second controllable current source I2. Moreover, the calibration current generation circuit 570 may include a first isolation switch S1 and a second isolation switch S2. The first isolation switch S1 is coupled between the first controllable current source I1 and the first input side of the gain stage 510. The second isolation switch S2 is coupled between the second controllable current source I2 and the second input side of the gain stage 510. In some embodiments, the first switch S1 and the second switch S2 of the calibration current generation circuit 570 is configured to close during a calibration period (thus connecting the first and second controllable current sources to the inputs of the gain stage 510), and to open otherwise (thus, disconnecting the first and second controllable current source from the gain stage 510).

Example Current Measuring Circuit Operation

Figure 6E:
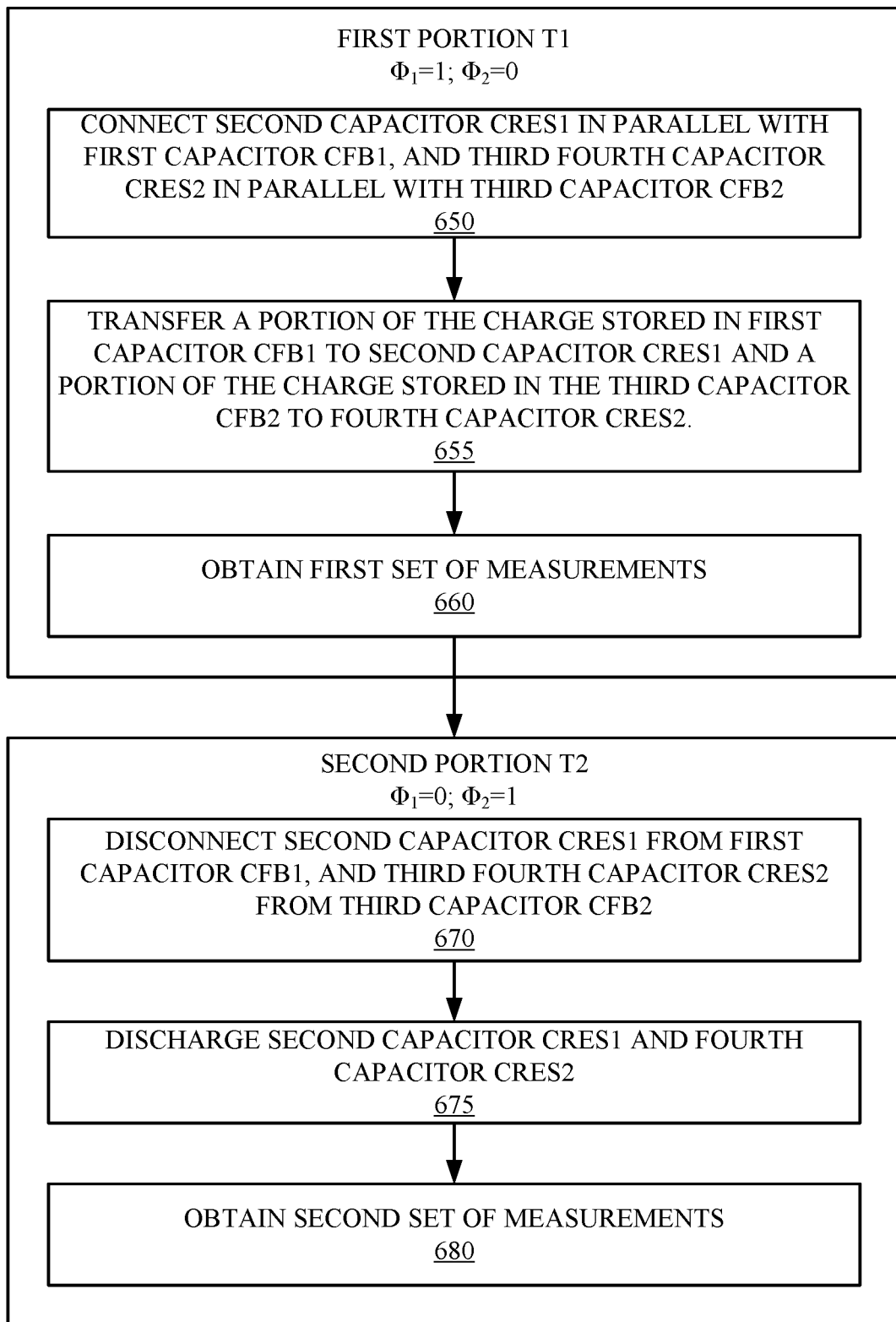
FIG. 6E illustrates a flow diagram of the operation of the current measurement circuit, according to one or more embodiments.

FIG. 6E illustrates a flow diagram of the operation of the current measurement circuit, according to one or more embodiments. In some embodiments, the process illustrated in FIG. 6E can include fewer, additional, or different steps than those described herein. Moreover, the steps of process may be performed in a different order than the one shown in FIG. 6E.

At the beginning of a first portion T1 of a period, the second capacitor Cres1 is connected 650 in parallel to the first capacitor Cfb1, and the fourth capacitor Cres2 is connected 650 in parallel to the third capacitor Cfb2. Moreover, in response to the second capacitor Cres1 being connected to the first capacitor Cfb1, a portion of the charge stored in the first capacitor Cfb1 is transferred 655 to the second capacitor Cres1 (partially discharging the first capacitor Cfb1 and charging the second capacitor Cres1). As such, a voltage across the first capacitor Cfb1 drops from a first value to a second value. Similarly, in response to the fourth capacitor Cres2 being connected to the third capacitor Cfb2, a portion of the charge stored in the third capacitor Cfb2 is transferred 655 to the fourth capacitor Cres2 (partially discharging the third capacitor Cfb2 and charging the fourth capacitor Cres2). As such, a voltage across the third capacitor Cfb2 also drops from a third value to a fourth value.

Moreover, during the first portion T1 of the period, the output Out_P–Out_N is measured 660 a set number of times. In some embodiments, the output Out_p–Out_N is measures multiple times during the first portion T1 of the period. In some embodiments, a first measurement of the output Out_P–Out_N is obtained a set delay $T_D$ after the beginning of the first portion T1 of the period. Moreover, subsequent measurements of the output Out_P–Out_N are obtained at set intervals (e.g., at a set frequency $f_{ADC}$).

At the end of the first portion T1 of the period and the beginning of the second portion T2 of the period, the second capacitor Cres1 is disconnected 670 from the first capacitor Cfb1, and the fourth capacitor Cres2 is disconnected 670 from the third capacitor Cfb2. Moreover, after the second capacitor Cres1 has been disconnected from the first capacitor Cfb1, the second capacitor Cres1 is discharged 675. Similarly, after the fourth capacitor Cres2 has been disconnected from the third capacitor Cfb2, the fourth capacitor Cres2 is discharged 675.

Moreover, during the second portion T2 of the period, the output Out_P–Out_N is measured 680 a set number of times. In some embodiments, the output Out_P–Out_N is measures multiple times during the second portion T2 of the period. In some embodiments, a first measurement of the output Out_P–Out_N during the second portion T2 of the period is obtained after a set amount of time the last measurement of the output Out_P–Out_N was obtained in the first portion T1 of the period. Subsequent measurements of the output Out_P–Out_N are obtained at set intervals (e.g., at a set frequency $f_{ADC}$).

Based on the obtained measurements, an average value of the output Out_P–Out_N is determined. Moreover, based on the determined average value, the level of the input current is determined. In some embodiments, the output Out_P–Out_N is sampled using an analog-to-digital converter (ADC). The analog voltage of the output Out_P–Out_N may be converted to a digital value and the average value of the output Out_P–Out_N is determined based on the determined digital values.

Example Amplifier Circuit Calibration Process

Figure 7A:
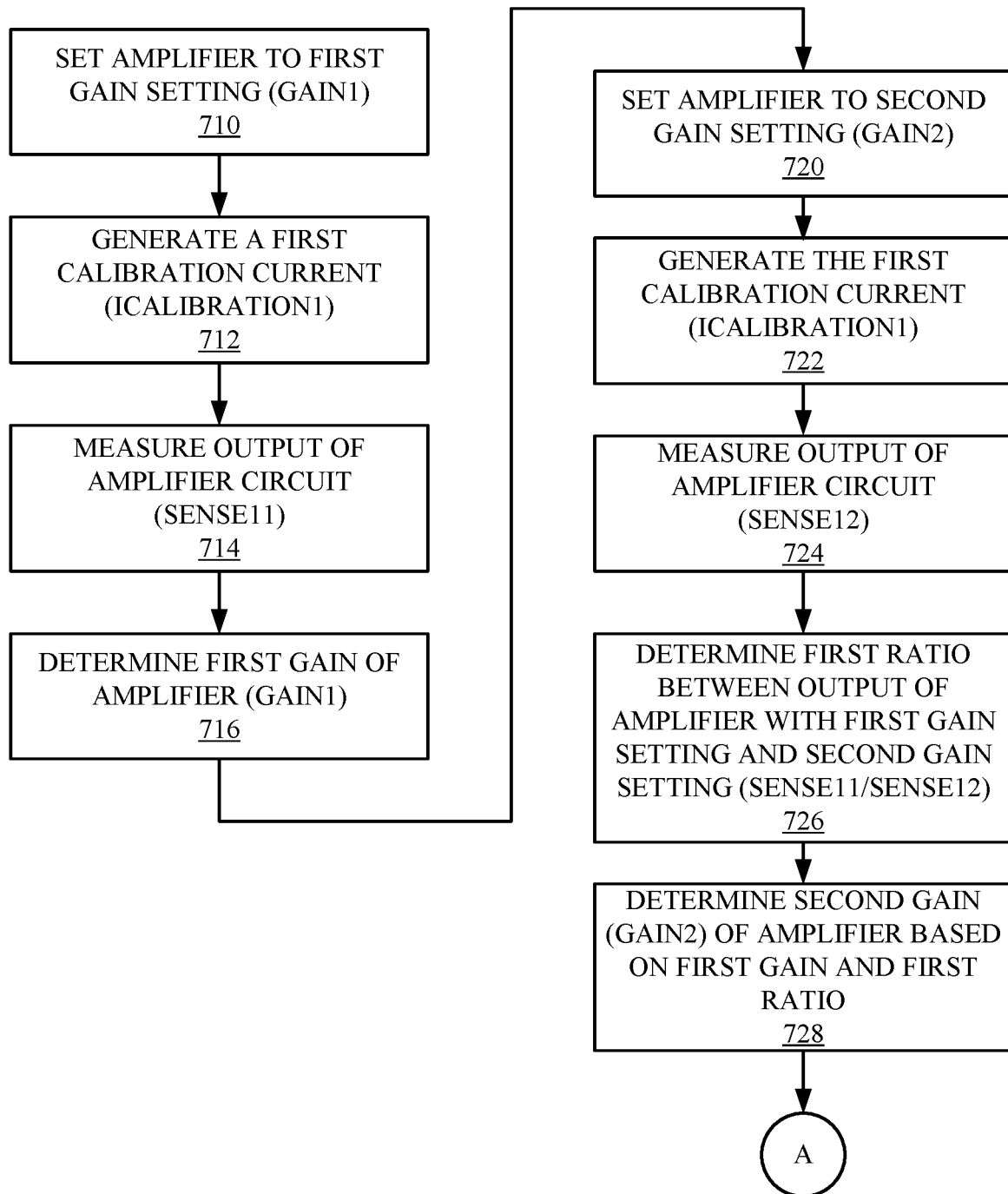
FIG. 7A and FIG. 7B illustrate a flow diagram of a process for determining the gain of an amplifier, according to one or more embodiments.
Figure 7B:
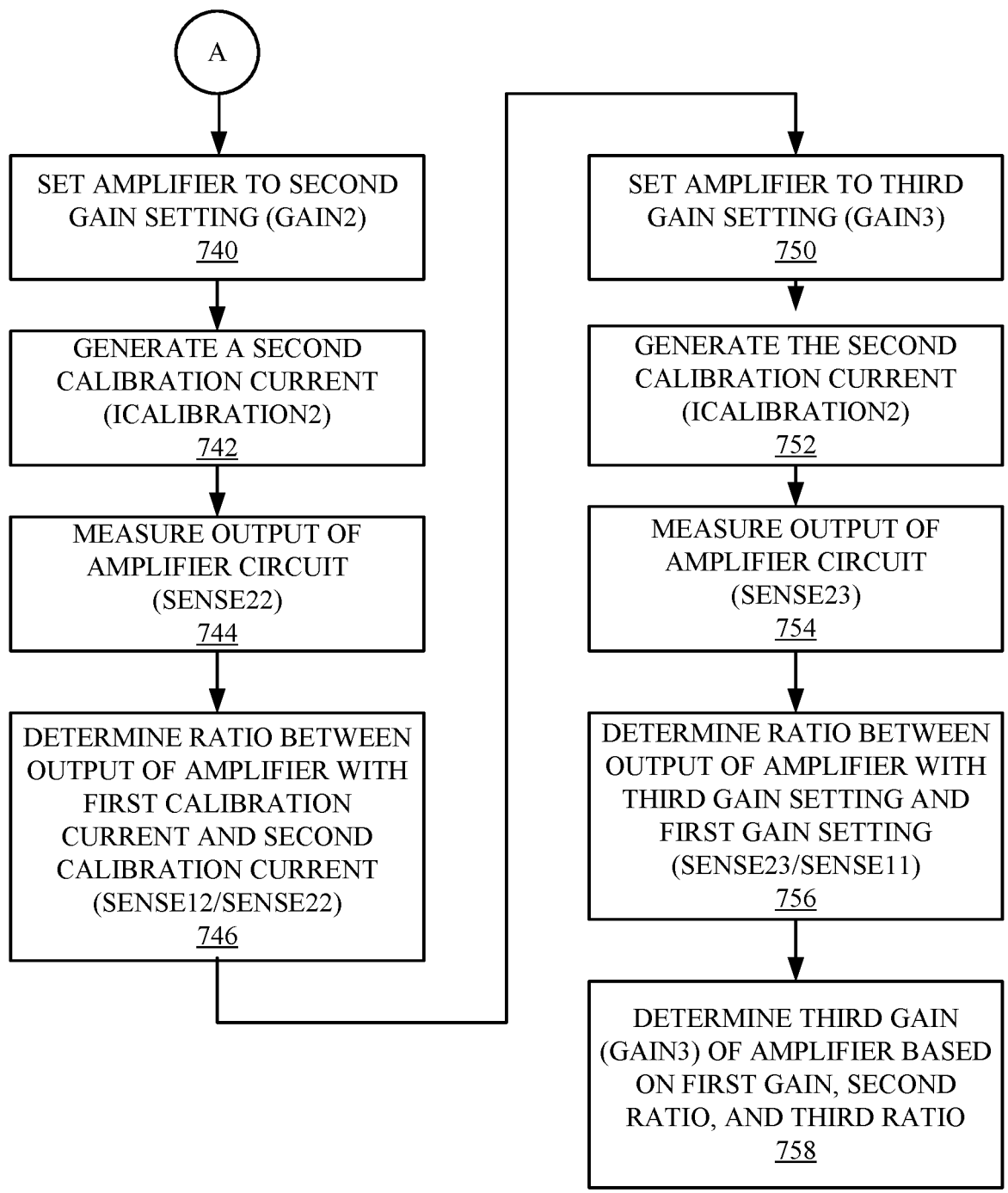

FIG. 7A and FIG. 7B illustrate a flow diagram of a process for determining the gain of an amplifier (such as the gain stage 510 of the current measurement circuit 320), according to one or more embodiments. The process illustrated in FIGS. 7A and 7B can include fewer, additional, or different steps than those described herein. Moreover, the steps of process may be performed in a different order than the one shown in FIGS. 7A and 7B.

In some embodiments, the calibration process for determining the gain of an amplifier is performed on an amplifier having one or more feedback loops implemented using capacitors (such as the gain stage 510 of the current measurement circuit 320 or the second gain stage 350). Alternatively, or in addition, the calibration process for determining the gain of an amplifier may be performed on amplifiers having other types of feedback loops. For example, the calibration process may be performed on amplifiers having resistive feedback loops.

In some embodiments, one or more of the amplifiers (such as the gain stage 510 of the current measurement circuit 320, or the second stage 350) have a configurable or variable gain. The gain of the amplifiers may be configurable by adjusting the capacitors of the feedback loops of the amplifiers. For instance, the gain of the gain stage 510 of the current measurement circuit 320 is configurable by adjusting the capacitance of the first capacitor Cfb1, the second capacitor Cres1, the third capacitor Cfb2, and/or the fourth capacitor Cres2. Similarly, the gain of the second gain stage 350 may be configurable by adjusting the capacitance of the first capacitor C1 or the second capacitor C2.

To determine the value of a first gain (gain1) of the amplifier, the amplifier is set 710 to a first gain setting corresponding to the first gain. The calibration current generation circuit 570 is controlled to generate 712 a first calibration current (Icalibration1). That is, the first controllable current source I1 and the second controllable current source I2 are controlled to generate the first calibration current. The first calibration current is then provided to the amplifier (e.g., by closing the isolation switches of the calibration current generation circuit 570), and the output of the amplifier circuit is measured 714. In some embodiments, the first gain of the amplifier is determined 716 based on the value of the first calibration current and the value of the output (sense11) of the amplifier circuit having the first gain setting and driven using the first calibration current.

$$\text{gain1} = \frac{\text{sense11}}{\text{Icalibration1}} \quad (5)$$

To determine the value of a second gain (gain2) of the amplifier, the amplifier is set 720 to a second gain setting corresponding to the second gain. The calibration current generation circuit 570 is controlled to generate 722 the first calibration current (Icalibration1). That is, the first controllable current source I1 and the second controllable current source I2 are controlled to generate the first calibration current. The first calibration current is then provided to the amplifier (e.g., by closing the isolation switches of the calibration current generation circuit 570), and the output of the amplifier circuit is measured 724. In some embodiments, a first ratio between the output (sense12) of the amplifier with the second gain setting and the output (sense11) of the amplifier with the first gain setting. Based on the value of the first gain (gain1) and the first ratio (sense12/sense11), the value of the second gain (gain2) is determined 728.

$$\text{gain2} = \frac{\text{sense12}}{\text{Icalibration1}} = \frac{\text{sense12}}{\text{sense11}}\text{gain1} \quad (6)$$

This process may be repeated to determine the value of gains of the amplifier with other gain setting.

In some embodiments, to determine the value of a third gain (gain3) of the amplifier, the amplifier is set 740 to the second gain setting corresponding to the second gain (gain2). The calibration current generation circuit 570 is controlled to generate 742 a second calibration current (Icalibration2). That is, the first controllable current source I1 and the second controllable current source I2 are controlled to generate the second calibration current. The second calibration current is then provided to the amplifier (e.g., by closing the isolation switches of the calibration current generation circuit 570), and the output of the amplifier circuit is measured 744. A second ratio between the output of the amplifier driven with the first calibration current and the output (sense22) of the amplifier driven with the second calibration current is determined 746.

$$\text{gain2} = \frac{\text{sense12}}{\text{Icalibration1}} = \frac{\text{sense22}}{\text{Icalibration2}} \quad (7)$$

$$\frac{\text{Icalibration1}}{\text{Icalibration2}} = \frac{\text{sense12}}{\text{sense22}} \quad (8)$$

Moreover, the amplifier is set 750 to a third gain setting corresponding to the third gain (gain3). The calibration current generation circuit 570 is controlled to generate 752 the second calibration current (Icalibration2). That is, the first controllable current source I1 and the second controllable current source I2 are controlled to generate the second calibration current. The second calibration current is then provided to the amplifier (e.g., by closing the isolation switches of the calibration current generation circuit 570), and the output of the amplifier circuit is measured 754. A third ratio between the output (sense23) of the amplifier with the third gain setting and driven with the second calibration current, and the output (sense11) of the amplifier with the first gain setting and driven with the first calibration current is determined 756. Based on the value of the first gain (gain1), the second ratio (sense12/sense22), and the third ratio (sense23/sense11), the value of the second gain (gain2) is determined 728.

$$\text{gain3} = \frac{\text{sense23}}{\text{Icalibration2}} = \frac{\text{sense23}}{\text{Icalibration1}} \times \frac{\text{Icalibration1}}{\text{Icalibration2}} = \quad (9)$$

$$\frac{\text{sense23}}{\text{Icalibration1}} \times \frac{\text{sense12}}{\text{sense22}} = \frac{\text{sense12}}{\text{sense22}} \times \frac{\text{sense23}}{\text{sense11}}\text{gain1}$$

In other embodiments, the third gain is determined based on a ratio between the output (sense23) of the amplifier with the third gain setting and driven with the second calibration current, and the output (sense22) of the amplifier with the second gain setting and driven with the second calibration current.

$$\text{gain3} = \frac{\text{sense23}}{\text{Icalibration2}} = \text{sense23} \times \frac{\text{gain2}}{\text{sense22}} = \frac{\text{sense23}}{\text{sense22}}\text{gain2} \quad (10)$$

This process may be repeated to determine the value of gains of the amplifier with other gain setting.

Example Level Shifter

Figure 8:
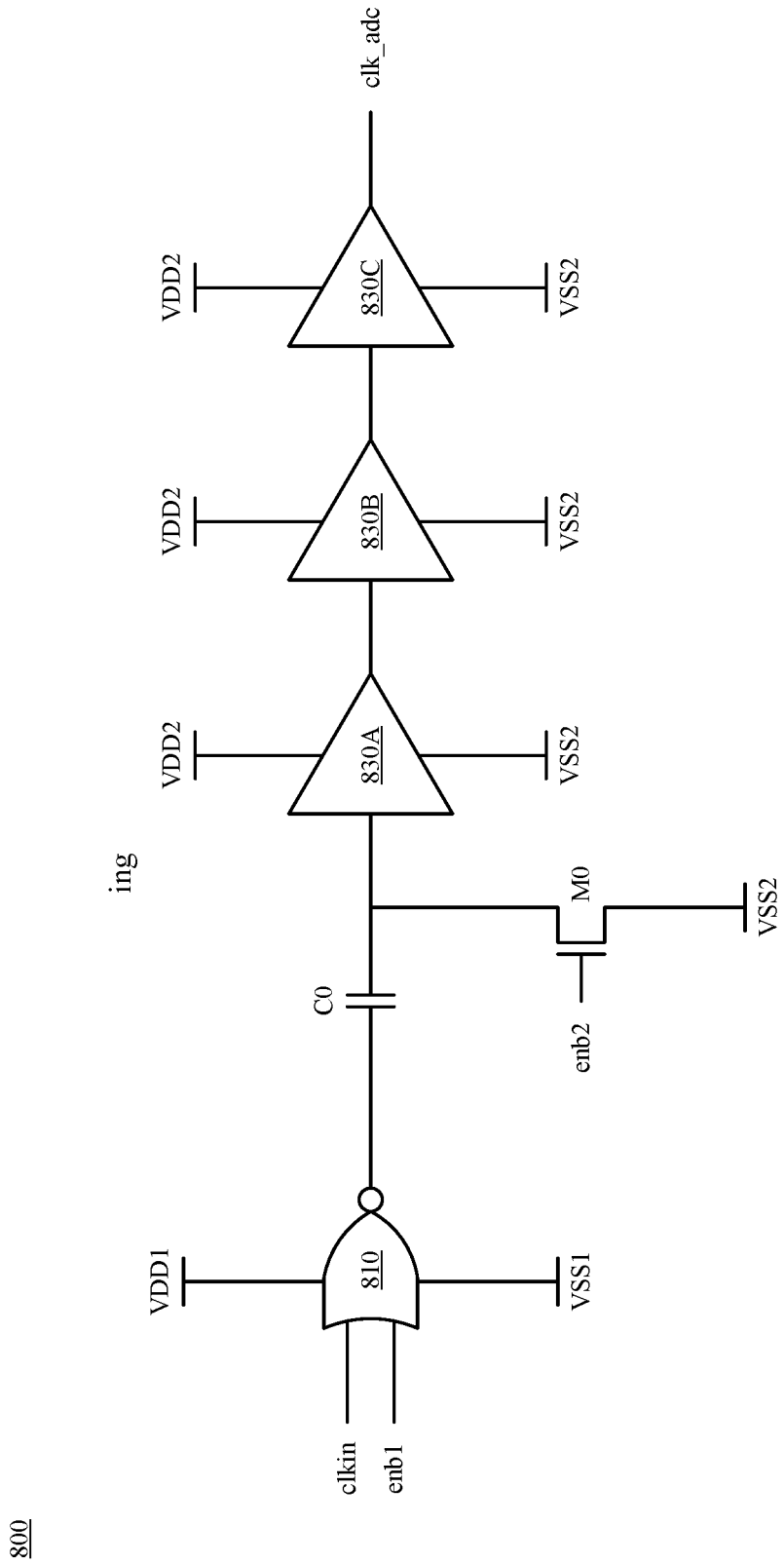
FIG. 8 illustrates a schematic diagram of a level shifter, according to one or more embodiments.

FIG. 8 illustrates a schematic diagram of a level shifter 800, according to one or more embodiments. The level shifter 800 generates an output clock signal clk_adc for controlling an ADC used for sampling the output of the dual-mode amplifier circuit 300 or the current measurement circuit 320. The output clock signal clk_adc is generated from a source clock signal clkin. In some embodiments, the source clock signal clkin is the clock signal used for controlling the current measurement circuit 320. Alternative, the source clock signal clkin is used for generating an additional clock signal for controlling the current measurement circuit 320. By using clock signals generated from the same source clock signal, the operation of the ADC and the current measurement circuit 320 are synchronized to each other.

The level shifter 800 includes a first logic gate 810 operating in a first power domain (VDD1/VSS1), a set of second logic gates 830 operating in a second power domain (VDD2/VSS2), a capacitor C0 between the first logic gate 810 and the set of second logic gates 830, and a transistor M0 coupled between an input of the set of second logic gates and a supply voltage.

In some embodiments, the first logic gate 810 is a NOR gate receiving as inputs a source clock signal and a first enable signal enb1. The first logic gate 810 is coupled to a first power supply VDD1 and a second power supply VSS1 in a first power domain.

In some embodiments, the set of second logic gates 830 are inverters or buffers. In the example of FIG. 8, the level shifter 800 include three inverters 830A through 830C connected in series. Each of the second logic gates 830 are coupled to a third power supply VDD2 and a fourth power supply VSS2 in a second power domain. In some embodiments, the second power domain (VDD2/VSS2) is a power domain in which the ADC for sampling an output of the dual-mode amplifier circuit 300 operates. Moreover, in some embodiments, the first power domain (VDD1/VSS1) is a power domain in which the dual-mode amplifier circuit 300 operates.

The capacitor C0 is coupled between the logic gates in the first power domain (VDD1/VSS) and the logic gates in the second power domain (VDD2/VSS2). In some embodiments, the capacitor C0 isolates the logic gates in the first power domain from the logic gates in the second power domain.

The transistor M0 is coupled between the input of the set of second logic gates and a supply voltage. In some embodiments, the transistor M0 is coupled to a supply voltage in the second power domain. The transistor M0 may be configured to set an initial voltage condition to the input of the set of second logic gates 830. In particular, the transistor M0 may have a first terminal coupled to the input of inverter 830A, and a second terminal coupled to VSS2. To set the initial condition to the set of second logic gates 830, the transistor MO is turned on (using the second enable signal enb2) and the input of the first inverter 830A is coupled to VSS2. By coupling the input of the inverter 830A to VSS2, the output of the inverter 830A is set to VDD2, which sets the input of the second inverter 830B, and so forth. Once the initial voltage condition of the set of second logic gates 830 is set, the transistor MO is turned off to disconnect the input of the inverter 830A from VSS2.

In some embodiments the source clock signal clkin, the first enable signal enb1, and the second enable signal enb2 are synchronized, such that after turning off transistor MO, the first incoming edge of the source clock signal clkin is a rising edge. As a result, at the rising edge of the source clock signal clkin, the input of the set of second logic gates 830 (i.e., the input of the first inverter 830A) increases to a value of VSS2+VDD1−VSS1. Moreover, when the falling edge of the source clock signal clkin arrives, the input of the set of second logic gates 830 (i.e., the input of the first inverter 830A) decreases back to VSS2. As such, the input voltage of the set of second logic gates 830 swings between VSS2+ VDD1−VSS1 and VSS2.

While particular embodiments and applications have been illustrated and described, it is to be understood that the invention is not limited to the precise construction and components disclosed herein and that various modifications, changes and variations which will be apparent to those skilled in the art may be made in the arrangement, operation and details of the method and apparatus disclosed herein without departing from the spirit and scope of the present disclosure.

What is claimed is:

1. A sensing circuit, comprising:
   a first gain stage, comprising:
   a first differential amplifier having a first input, a second input, a first output, and a second output,
   a first feedback loop coupled between the first input and the first output of the first differential amplifier, the first feedback loop comprising:
   a first capacitor having a first terminal coupled to the first input of the first differential amplifier and a second terminal coupled to the first output of the first differential amplifier,
   a second capacitor having a first terminal and a second terminal, and
   a first switch coupled between the first terminal of the second capacitor and the first terminal of the first capacitor, the first switch configured to connect the second capacitor in parallel with the first capacitor and to disconnect the second capacitor from the first capacitor based on a first control signal, and
   a second feedback loop coupled between the second input and the second output of the first differential amplifier, the second feedback loop comprising:
   a third capacitor having a first terminal coupled to the second input of the first differential amplifier and a second terminal coupled to the second output of the first differential amplifier,
   a fourth capacitor having a first terminal and a second terminal, and
   a second switch coupled between the first terminal of the third capacitor and the first terminal of the fourth capacitor, the second switch configured to connect the third capacitor in parallel with the fourth capacitor and to disconnect the fourth capacitor from the third capacitor based on the first control signal; and
   a processor circuit configured to generate the first control signal for controlling the first switch and the second switch.

2. The sensing circuit of claim 1, wherein the first feedback loop further comprises:
   a third switch coupled between the second terminal of the second capacitor and the second terminal of the first capacitor, the third switch configured to connect the second capacitor in parallel with the first capacitor and to disconnect the second capacitor from the first capacitor based on the first control signal.

3. The sensing circuit of claim 1, wherein the processor circuit is further configured to generate the first control signal to close the first switch during a first portion of a measurement cycle to connect the second capacitor to the first capacitor, and to open the first switch during a second portion of the measurement cycle to disconnect the second capacitor from the first capacitor.

4. The sensing circuit of claim 3, wherein first feedback loop further comprises:
   a third switch coupled between the first terminal of the second capacitor and a supply voltage, the third switch for discharging the second capacitor based on a second control signal; and
   a fourth switch coupled between the second terminal of the second capacitor and the supply voltage, the fourth switch for discharging the second capacitor based on the second control signal, and
   the processor circuit is further configured to generate the second control signal to open the third switch and the fourth switch during the first portion of a measurement cycle, and to close the third switch and the fourth switch during the second portion of the measurement cycle to discharge the second capacitor.

5. The sensing circuit of claim 1, further comprising:
   a second gain stage coupled to the first gain stage, the second gain stage comprising:
   a second differential amplifier having a first input, a second input, a first output, and a second output,
   a fifth capacitor coupled between the first input and the first output of the second differential amplifier,
   a third switch coupled between the first input and the first output of the second differential amplifier, the third switch configured to discharge the fifth capacitor,
   a sixth capacitor coupled between the second input and the second output of the second differential amplifier,
   a fourth switch coupled between the second input and the second output of the second differential amplifier, the fourth switch configured to discharge the sixth capacitor.

6. The sensing circuit of claim 1, wherein the first switch is closed during a first portion of a measurement cycle and opened during a second portion of the measurement cycle, and wherein the sensing circuit further comprises:
   an analog-to-digital converter (ADC) configured to sample the output of the second gain stage one or more times during the first portion of the measurement cycle and at least one time during the second portion of the measurement cycle.

7. The sensing circuit of claim 6, further comprising:
   a level shifter circuit configured to generate a first clock signal in a first power domain for controlling the first gain stage, and a second clock signal in a second power domain for controlling the ADC.

8. The sensing circuit of claim 1, further comprising:
a calibration current generation circuit for calibrating a set of gains of the first gain stage, the calibration current generation circuit configured to:
provide a first calibration current to the first gain stage configured with a first gain setting and measure a first output,
provide the first calibration current to the first gain stage configured with a second gain setting and measure a second output, and
determine the second gain setting based on a ratio between the second output and the first output.

9. The sensing circuit of claim 8, wherein the calibration current generation circuit is further configured to:
provide a second calibration current to the first gain stage configured with the second gain setting and measure a third output;
provide the second calibration current to the first gain stage configured with a third gain setting and measure a fourth output; and
determine the third gain setting based on a ratio between the second output and the third output, and a ratio between the fourth output and the first output.

* * * * *